(12) United States Patent
Fang et al.

(10) Patent No.: US 8,283,188 B2
(45) Date of Patent: Oct. 9, 2012

(54) METHOD FOR FABRICATING LIGHT EMITTING DIODE CHIP

(75) Inventors: Kuo-Lung Fang, Hsinchu County (TW); Chien-Sen Weng, Hsinchu County (TW); Chih-Wei Chao, Taipei (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 13/220,693

(22) Filed: Aug. 30, 2011

(65) Prior Publication Data

US 2011/0318855 A1    Dec. 29, 2011

Related U.S. Application Data

(62) Division of application No. 12/398,165, filed on Mar. 4, 2009, now Pat. No. 8,043,873.

(30) Foreign Application Priority Data

Dec. 26, 2008  (TW) .............................. 97151136 A

(51) Int. Cl.
*H01L 21/00*    (2006.01)

(52) U.S. Cl. .................................. 438/22; 257/E25.032

(58) Field of Classification Search .................. 438/22; 257/E25.032, 13, 79

See application file for complete search history.

(56) References Cited

U.S. PATENT DOCUMENTS

| | | | |
|---|---|---|---|
| 6,410,942 B1 * | 6/2002 | Thibeault et al. | 257/88 |
| 7,139,297 B2 * | 11/2006 | Jikutani et al. | 372/45.01 |
| 2009/0114940 A1 * | 5/2009 | Yang et al. | 257/99 |
| 2010/0015742 A1 * | 1/2010 | Fang et al. | 438/46 |

\* cited by examiner

*Primary Examiner* — Thao P. Le

(74) *Attorney, Agent, or Firm* — Thomas|Kayden

(57) ABSTRACT

A method for fabricating a light emitting diode chip is provided. Firstly, a semiconductor device layer is formed on a substrate. Afterwards, a current spreading layer is formed on a portion of the semiconductor device layer. Then, a current blocking layer and a passivation layer are formed on a portion of the semiconductor device layer not covered by the current spreading layer. Finally, a first electrode is formed on the current blocking layer and the current spreading layer. Moreover, a second electrode is formed on the semiconductor device layer.

28 Claims, 26 Drawing Sheets

METHOD FOR FABRICATING LIGHT EMITTING DIODE CHIP

CROSS-REFERENCE TO RELATED APPLICATION

This application is a divisional of and claims the priority benefit of U.S. application Ser. No. 12/398,165 filed on Mar. 4, 2009, now allowed, which claims the priority benefit of Taiwan application serial no. 97151136, filed on Dec. 26, 2008. The entirety of each of the above-mentioned patent applications is hereby incorporated by reference herein and made a part of this specification.

BACKGROUND OF THE INVENTION

1. Field of the Invention

The present invention relates to a method of fabricating a chip, and more particularly to a method of fabricating a light emitting diode (LED) chip.

2. Description of Related Art

FIGS. 1A through 1F schematically illustrate cross-sectional views of a fabricating process of a conventional light emitting diode chip. Firstly, a first type semiconductor material layer 122, a light emitting material layer 124, and a second type semiconductor material layer 126 are sequentially formed on a substrate 110 to form a semiconductor stacked layer 128. Here, a method of forming the semiconductor stacked layer 128 is, for example, a metal organic chemical vapor deposition (MOCVD) process, or other suitable epitaxial processes to form the semiconductor stacked layer 128 as shown in FIG. 1A.

Next, the semiconductor stacked layer 128 is patterned to form a semiconductor device layer 120. The semiconductor device layer 120 as shown in FIG. 1B is formed by a conventional photolithography and etching process (PEP).

Thereafter, a current blocking layer 130 is formed on an upper surface 120a of the semiconductor device layer 120. Here, the current blocking layer 130 as shown in FIG. 1C is formed by the conventional PEP. Specifically, the method of forming the current blocking layer 130 is forming a dielectric material layer (not shown) entirely on the substrate 110. Then, the dielectric material layer is patterned by the PEP to form the current blocking layer 130 as shown by FIG. 1C.

Afterwards, a current spreading layer 140 is formed on an upper surface 120a of the semiconductor device layer 120 to cover the current blocking layer 130. The current spreading layer 140 is formed by the conventional PEP. In other words, the method of forming the current spreading layer 140 is forming a conductive layer (not shown) entirely on the substrate 110 to cover the semiconductor device layer 120 and the current blocking layer 130. Next, the conductive layer is patterned by the PEP to form the current spreading layer 140 as shown by FIG. 1D.

Upon completion of the foregoing steps, a plurality of electrodes 150 is formed on the current spreading layer 140 and the semiconductor device layer 120. The electrodes 150 are formed by the conventional PEP. Specifically, the method of forming the electrodes 150 is forming an electrode material layer (not shown) entirely on the current spreading layer 140 and the semiconductor device layer 120. Next, the electrode material layer is patterned by the PEP to form the electrodes 150 on the current spreading layer 140 and the semiconductor device layer 120, as shown by FIG. 1E.

Then, a passivation layer 160 is formed on the current spreading layer 140 and the semiconductor device layer 120 not covered by the electrodes 150. The passivation layer 160 is formed by the conventional PEP, for example. Specifically, the method of forming the passivation layer 160 is forming a dielectric material layer (not shown) entirely on the substrate 110 to cover the current spreading layer 140, the electrodes 150, and the semiconductor device layer 120. Next, the electrode material layer is patterned by the PEP to form the passivation layer 160 on the current spreading layer 140 and the semiconductor device layer 120 not covered by the electrodes 150, as shown in FIG. 1F. So far, the fabricating steps of the conventional light emitting diode chip 100 are generally completed.

In view of the foregoing, the fabrication of the conventional light emitting diode chip 100 requires at least five PEPs. In other words, the light emitting diode chip 100 requires at least five masks of different patterns to perform the PEPs aforementioned. Since each of the masks is rather costly, the fabrication cost and the fabrication time of the light emitting diode chip 100 can not be reduced.

SUMMARY OF THE INVENTION

The present invention provides a method of fabricating a light emitting diode chip, which has simpler fabricating steps and is compatible with current processes.

The present invention provides a method of fabricating a light emitting diode chip. Firstly, a semiconductor device layer is formed on a substrate. Next, a current spreading layer is formed on a portion of the semiconductor device layer. Then, a current blocking layer and a passivation layer are formed on a portion of the semiconductor device layer that is not covered by the current spreading layer. Afterwards, a first electrode is formed on the current blocking layer and the current spreading layer. Subsequently, a second electrode is formed on the semiconductor device layer.

According to an embodiment of the present invention, the method of forming the current spreading layer includes the following steps. Firstly, a conductive layer is formed on the second type semiconductor layer. Then, the conductive layer is patterned to form the current spreading layer.

In one embodiment of the present invention, the current spreading layer has an opening to expose an upper surface of the second type semiconductor layer, and the current blocking layer contacts with the upper surface of the second type semiconductor layer through the opening.

In one embodiment of the present invention, a contact area of the current blocking layer and the second type semiconductor layer substantially equals to a bottom area of the opening.

In one embodiment of the present invention, the contact area of the current blocking layer and the second type semiconductor layer is substantially smaller than the bottom area of the opening.

In one embodiment of the present invention, a portion of the second type semiconductor layer exposed by the opening but not covered by the current blocking layer is electrically connected to the first electrode.

In one embodiment of the present invention, a method of forming the current blocking layer and the passivation layer includes the following steps. Firstly, a dielectric layer is formed on a portion of the semiconductor device layer that is not covered by the current spreading layer. Then, the dielectric layer is patterned to form the current blocking layer and the passivation layer simultaneously.

The present invention further provides a method of fabricating a light emitting diode chip. Firstly, a semiconductor device layer is formed on a substrate. Next, a current blocking layer and a passivation layer are formed on a portion of the semiconductor device layer. Then, a portion of the semiconductor device layer which is not covered by the current blocking layer and the passivation layer is removed, so as to form a plurality of identification recesses on the semiconductor device layer. Afterwards, a current spreading layer is formed on the current blocking layer and a portion of the semiconductor device layer. Subsequently, a first electrode is formed on the current spreading layer. Lastly, a second electrode is formed on the semiconductor device layer.

In one embodiment of the present invention, a method of forming the current blocking layer and the passivation layer includes the following steps. Firstly, a dielectric layer is formed on a semiconductor device layer. Then, the dielectric layer is patterned to form the current blocking layer and the passivation layer simultaneously.

In one embodiment of the present invention, a material of the dielectric layer includes a silicon carbide based material.

In one embodiment of the present invention, the material of the dielectric layer includes silicon oxide, silicon nitride, or silicon oxynitride.

In one embodiment of the present invention, a method of forming the identification recesses includes etching.

In one embodiment of the present invention, the method of forming the current spreading layer includes the following steps. Firstly, a conductive layer is formed on the second type semiconductor layer and the current blocking layer. Then, the conductive layer is patterned to form the current spreading layer.

In one embodiment of the present invention, the current spreading layer has an opening to expose an upper surface of the current blocking layer, and the first electrode contacts with the upper surface of the current blocking layer through the opening.

The present invention further provides a method of fabricating a light emitting diode chip. Firstly, a semiconductor device layer is formed on a substrate. Then, a patterned functional layer with multi-layer structure is formed simultaneously on a portion of the semiconductor device layer. Next, a current spreading layer is formed on a portion of the patterned functional layer and a portion of the semiconductor device layer. Afterwards, a first electrode is formed on the current spreading layer. Subsequently, a second electrode is formed on the semiconductor device layer.

In one embodiment of the present invention, a method of forming the semiconductor device layer includes the following steps. Firstly, a semiconductor layer is formed on the substrate. Then, the semiconductor layer is patterned to form the semiconductor device layer.

In one embodiment of the present invention, a method of forming the semiconductor device layer includes the following steps. Firstly, a first type semiconductor material layer, a light emitting material layer, and a second type semiconductor material layer are sequentially formed on the substrate. Next, the second type semiconductor material layer, the light emitting material layer, and the first type semiconductor material layer are patterned to form a first type semiconductor layer, a light emitting layer, and a second type semiconductor layer. The light emitting layer is disposed on a portion of the first type semiconductor layer, and the second type semiconductor layer is disposed on the light emitting layer.

In one embodiment of the present invention, the method of forming the patterned functional layer includes following steps. Firstly, a first dielectric layer is formed on the semiconductor device layer. Then, an alignment identification layer is formed on the first dielectric layer. Next, the first dielectric layer and the alignment identification layer are patterned to form a current blocking layer and a passivation layer simultaneously.

In one embodiment of the present invention, the method of forming the patterned functional layer includes following steps. Firstly, a first dielectric layer is formed on the semiconductor device layer. Then, an alignment identification layer is formed on the first dielectric layer. Afterwards, the first dielectric layer and the alignment identification layer are patterned to simultaneously form a current blocking layer, a passivation layer, and an isolating trench disposed within the passivation layer.

In one embodiment of the present invention, the method of forming the patterned functional layer includes following steps. Firstly, a first dielectric layer is formed on the semiconductor device layer. Then, an alignment identification layer is formed on the first dielectric layer. Next, a second dielectric layer is formed on the alignment identification layer. Afterwards, the first dielectric layer, the alignment identification layer, and the second dielectric layer are patterned to form a current blocking layer and a passivation layer simultaneously.

In one embodiment of the present invention, the method of forming the patterned functional layer includes following steps. Firstly, a first dielectric layer is formed on the semiconductor device layer. Then, an alignment identification layer is formed on the first dielectric layer. Next, a second dielectric layer is formed on the alignment identification layer. Afterwards, the first dielectric layer, the alignment identification layer, and the second dielectric layer are patterned to simultaneously form a current blocking layer, a passivation layer, and an isolating trench disposed within the passivation layer.

In one embodiment of the present invention, a material of the first dielectric layer or the second dielectric layer includes a silicon carbide based material.

In one embodiment of the present invention, the silicon carbide based material includes $SiO_xC_y$: H, SiC, $SiC_xN_y$, or $SiO_xC_yN_z$.

In one embodiment of the present invention, the material of the first dielectric layer or the second dielectric layer includes silicon oxide, silicon nitride, or silicon oxynitride.

In one embodiment of the present invention, a material of the alignment identification layer includes metal.

In one embodiment of the present invention, the method of forming a current spreading layer includes the following steps. Firstly, a conductive layer is formed on a second type semiconductor layer and a current blocking layer. Then, the conductive layer is patterned to form the current spreading layer.

In one embodiment of the present invention, the current blocking layer has an opening to expose an upper surface of the second type semiconductor layer, and the current spreading layer contacts with the upper surface of the second type semiconductor layer through the opening.

In one embodiment of the present invention, the current blocking layer and the current spreading layer are fabricated simultaneously with the same PEP. Hence, the steps of fabricating the light emitting diode chip can be reduced so as to save the fabrication cost and the fabrication time. Moreover, the present invention provides design of a patterned functional layer to simultaneously form the current blocking layer and the current spreading layer. Additionally, the accuracy of alignment is improved so as to enhance the reliability of the fabricating process.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1A:
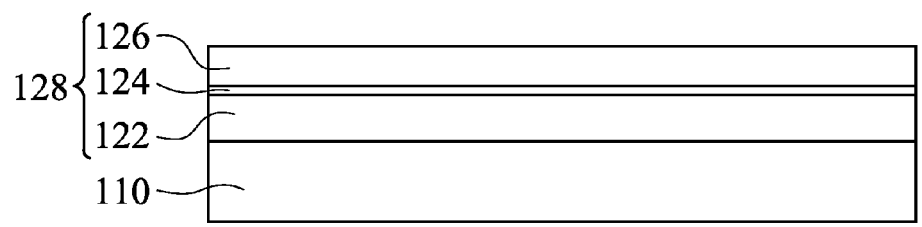
FIGS. 1A through 1F schematically illustrate cross-sectional views of a fabricating process of a conventional light emitting diode chip.
Figure 1B:
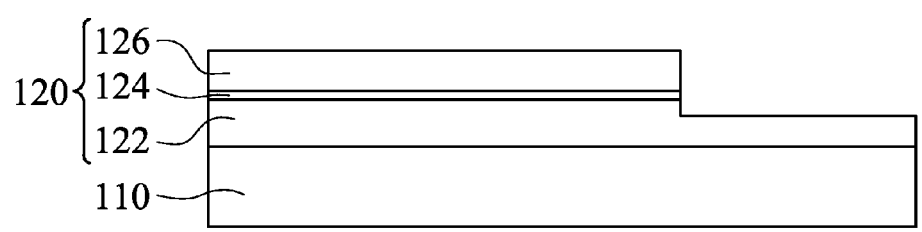
Figure 1C:
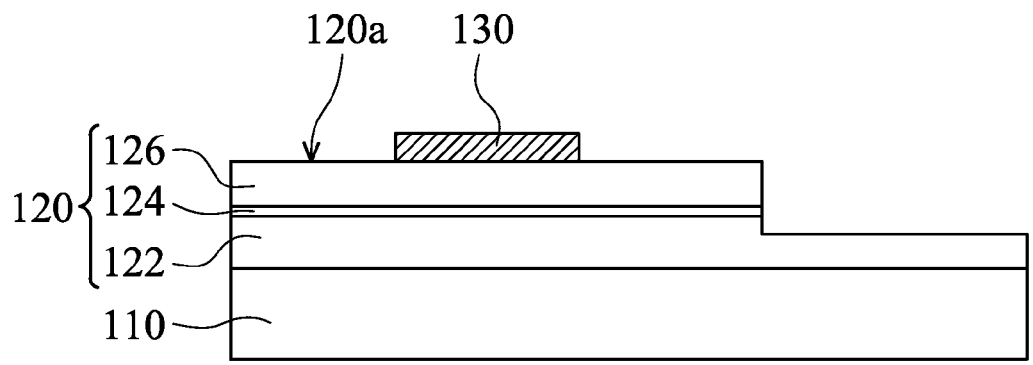
Figure 1D:
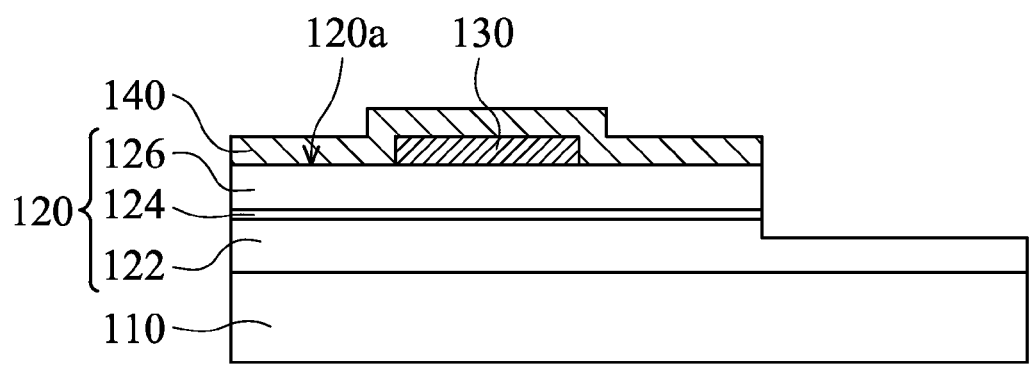
Figure 1E:
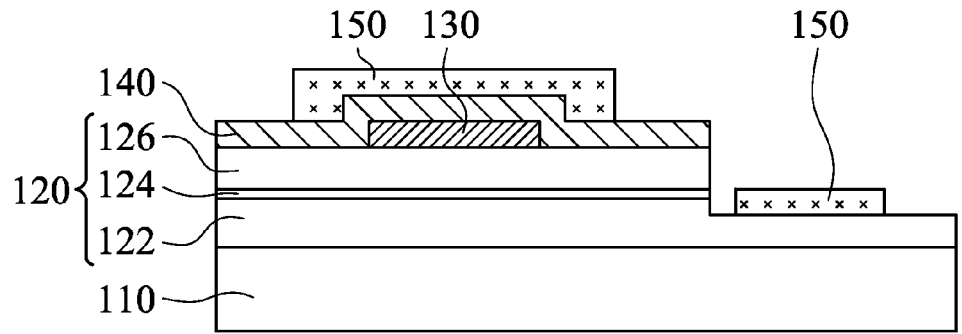
Figure 1F:
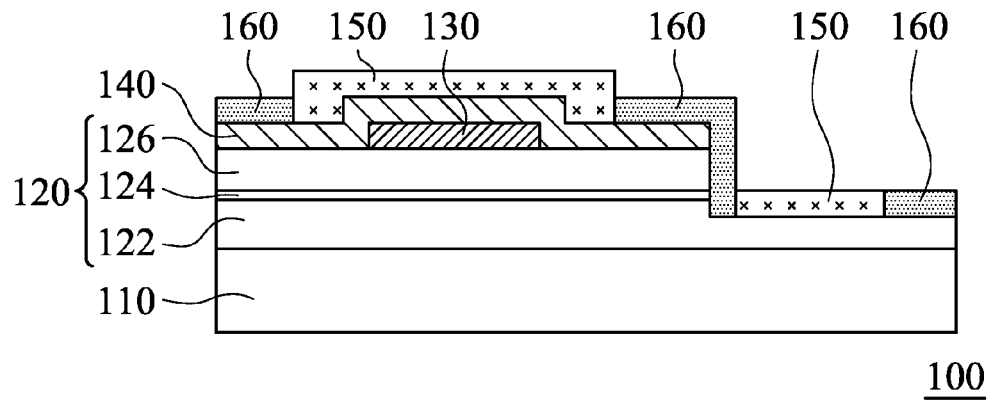
Figure 2A:
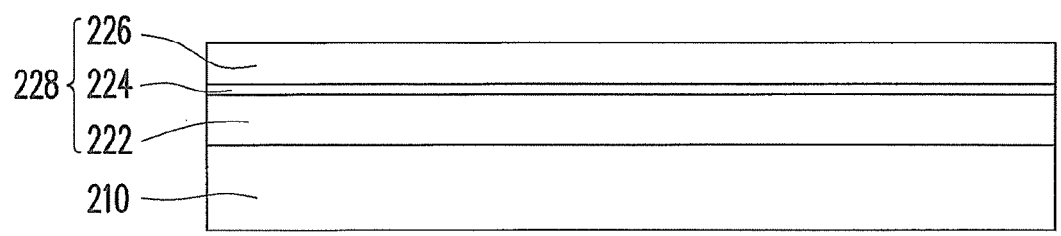
FIGS. 2A through 2E schematically illustrate cross-sectional views of a fabricating process of a light emitting diode chip according to a first embodiment of the present invention.

FIGS. 2A through 2E schematically illustrate cross-sectional views of a fabricating process of a light emitting diode chip according to a first embodiment of the present invention. Firstly, a first type semiconductor material layer 222, a light emitting material layer 224, and a second type semiconductor material layer 226 are sequentially formed on a substrate 210 to form a semiconductor layer 228, as illustrated by FIG. 2A. The semiconductor layer 228 is formed, for example, by a metal organic chemical vapor deposition (MOCVD) process, a molecular beam epitaxial (MBE) process, or other suitable epitaxial growth processes, to sequentially form the first type semiconductor material layer 222, the light emitting material layer 224, and the second type semiconductor material layer 226 on the substrate 210. The present embodiment illustrates an MOCVD process as an example, but the present invention is not limited thereto. In the present embodiment, a material of the substrate 210 is an aluminum oxide with good transmittance, for example. Furthermore, in an embodiment of the invention, a material of the first type semiconductor material layer 222 is an N-type semiconductor material, the light emitting material layer 224 is a multiple quantum well (MQW) light emitting layer, and a material of the second type semiconductor material layer 226 is a P-type semiconductor material. However, in other embodiments, the materials for the first type semiconductor material layer 222 and the second type semiconductor material layer 226 may also be a P-type semiconductor material and an N-type semiconductor material respectively.

Figure 2B:
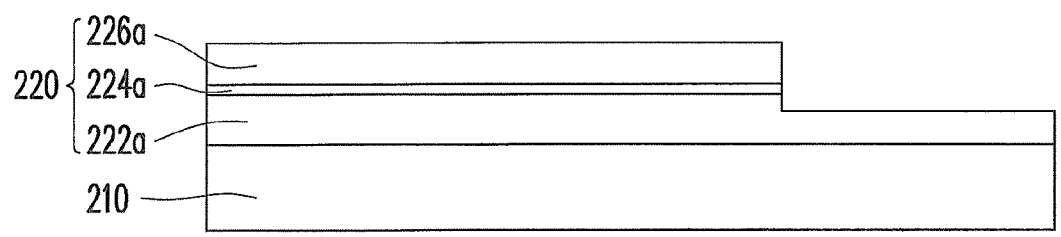

Afterwards, the semiconductor layer 228 is patterned to form a semiconductor device layer 220, as illustrated in FIG. 2B. In the present embodiment, the semiconductor device layer 220 is formed, for example, by a conventional photolithography and etching process (PEP). For example, after the semiconductor layer 228 is formed on the substrate 210, the second type semiconductor material layer 226, the light emitting material layer 224 and the first type semiconductor material layer 222 are patterned by the PEP to form a first type semiconductor device layer 222a, a light emitting device layer 224a and a second type semiconductor device layer 226a, as shown in FIG. 2B. The light emitting device layer 224a is disposed on a portion of the first type semiconductor device layer 222a, and the second type semiconductor device layer 226a is disposed on the light emitting layer 224a.

Figure 2C:
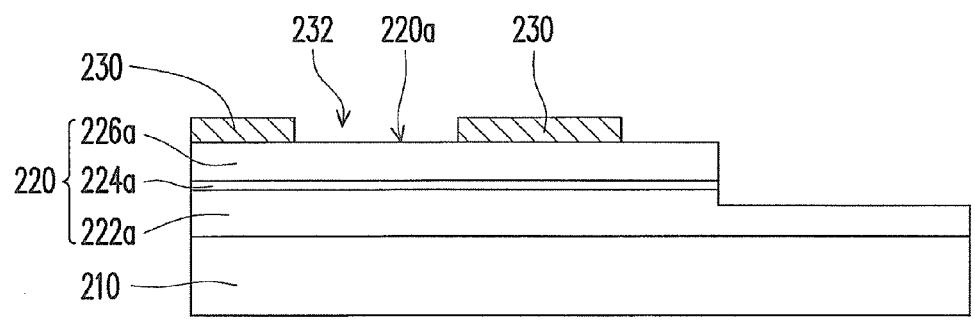

Afterwards, a current spreading layer 230 is formed on a portion of the semiconductor device layer 220, as illustrated by FIG. 2C. In the present embodiment, the current spreading layer 230 is formed, for example, by the conventional PEP. In an embodiment of the present invention, upon completion of the foregoing steps, a conductive layer (not shown) is formed entirely on the second type semiconductor device layer 226a. Then, the conductive layer is patterned to form the current spreading layer 230. The current spreading layer 230 has an opening 232 to expose an upper surface 220a of the second type semiconductor layer 226a, as illustrated by FIG. 2C. In the present embodiment, the opening 232 may be a circular opening, an annular opening or an opening in other shapes. Moreover, a material of the current spreading layer 230 is, for example, indium tin oxide (ITO), indium zinc oxide (IZO), indium tin zinc oxide (ITZO), hafnium oxide, zinc oxide, aluminum oxide, aluminum tin oxide, aluminum zinc oxide, cadmium tin oxide, cadmium zinc oxide, or other suitable transparent conductive materials. In the present embodiment, the current spreading layer 230 is fabricated by ITO.

Figure 2D:
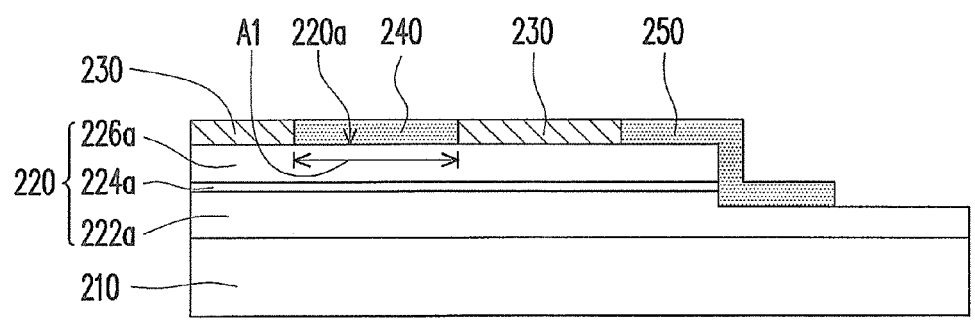

Then, a current blocking layer 240 and a passivation layer 250 are formed on a portion of the semiconductor device layer 220 that is not covered by the current spreading layer 230, as illustrated by FIG. 2D. In the present embodiment, the current blocking layer 240 and the passivation layer 250 are formed, for example, by forming a dielectric layer (not shown) entirely on a portion of the semiconductor device layer 220 that is not covered by the current spreading layer 230. Afterwards, the dielectric layer is patterned by the conventional PEP, so as to form the current blocking layer 240 and the passivation layer 250 simultaneously. Hence, the current blocking layer 240 contacts with the upper surface 220a of the second type semiconductor layer 226a through the opening 232. Moreover, a contact area of the current blocking 240 and the second type semiconductor layer 226a substantially equals to a bottom area A1 of the opening 232, as shown in FIG. 2D.

In addition, the dielectric layer is formed, for example, by a plasma enhanced chemical vapor deposition (PECVD) process, but the present embodiment is not limited thereto. Other suitable processes may also be used, such as a screen printing process, a coating process, or an inkjet printing process (IJP process). In the present embodiment, the dielectric layer may be a single-layered or a multi-layered structure, and a material of the dielectric layer is, for example, a silicon carbide based material. The silicon carbide based material is $SiO_xC_y$: H, SiC, $SiC_xN_y$, or $SiO_xC_yN_z$, for example. In an embodiment of the present invention, the dielectric layer of the silicon carbide based material will not be easily eroded by a buffered oxide etch (BOE) process with the use of hydrofluoric acid (HF), etc. Thus, the fabricating process will have a better reliability.

In other embodiments, a material of the dielectric layer can also be an organic or an inorganic material listed below. An organic material is, for example, silicon oxide, silicon nitride, silicon oxynitride, silicon carbide, hafnium oxide, aluminum oxide, or other suitable materials. An inorganic material is, for example, photoresist, benzocyclobutene, cycloalkene, polyimide, polyamide, polyester, polyalcohol, polyethylene oxide, polyphenylene, resin, polyether, polyketone or other suitable materials. The embodiment described above is merely exemplary, and the present invention is not limited thereto.

Figure 2E:
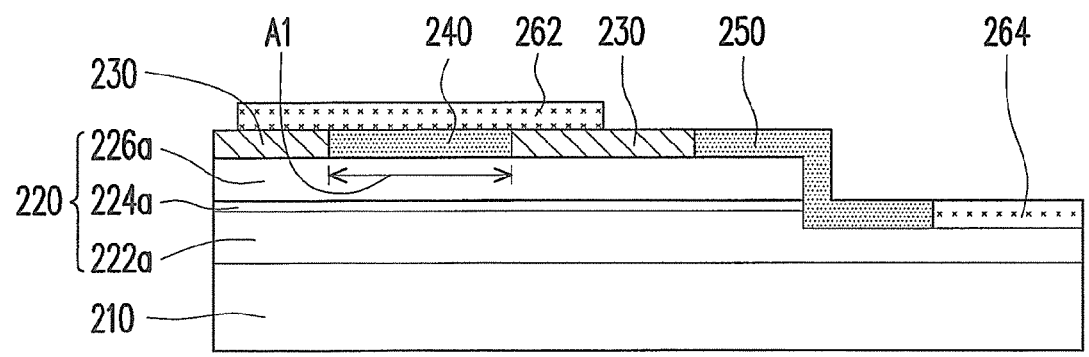

Next, a first electrode 262 is formed on the current blocking layer 240 and the current spreading layer 230, and a second electrode 264 is formed on the semiconductor device layer 220, as illustrated by FIG. 2E. In the present embodiment, the first electrode 262 and the second electrode 264 are formed, for example, by the conventional PEP. In an embodiment of the present invention, a patterned photoresist layer (not shown) is formed on the current blocking layer 240, the current spreading layer 230, and the semiconductor device layer 220. Afterwards, an electrode material layer (not shown) is formed entirely on the substrate 210. Then, the patterned photoresist layer is removed, such that the electrode material layer on the patterned photoresist layer is also removed (i.e. lift-off process) to form the first electrode 262 and the second electrode 264 as shown in FIG. 2E.

In detail, when the light emitting diode chip 200 is emitting the light, the current blocking layer 240 and the current spreading layer 230 can distribute the current evenly, so that the light emitting layer 224a emits a more even light. Furthermore, the protection layer 250 is suitable for preventing the semiconductor device layer 220 from being damaged or oxidized by influences of the exterior environment and then enhancing electrical characteristics of the light emitting diode chip 200 when driven.

In the present embodiment, the current blocking layer 240 and the passivation layer 250 of the light emitting diode chip 200 are fabricated simultaneously by conventional PEP, such that the fabricating steps can be reduced to minimize the fabrication cost and the fabrication time of the light emitting diode chip 200 effectively. Moreover, as the silicon carbide based material is applied in the current blocking layer 240, the current blocking layer 240 will not be easily eroded by the BOE process with the use of HF, etc. Thus, the reliability of the fabricating process is increased.

Figure 3A:
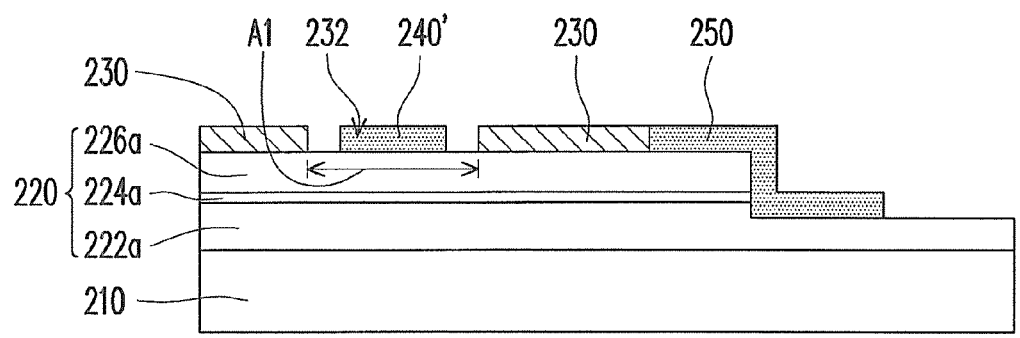
FIGS. 3A to 3B schematically illustrate cross-sectional views of a fabricating process of a light emitting diode chip according to another mode of embodiment of the present invention.
Figure 3B:
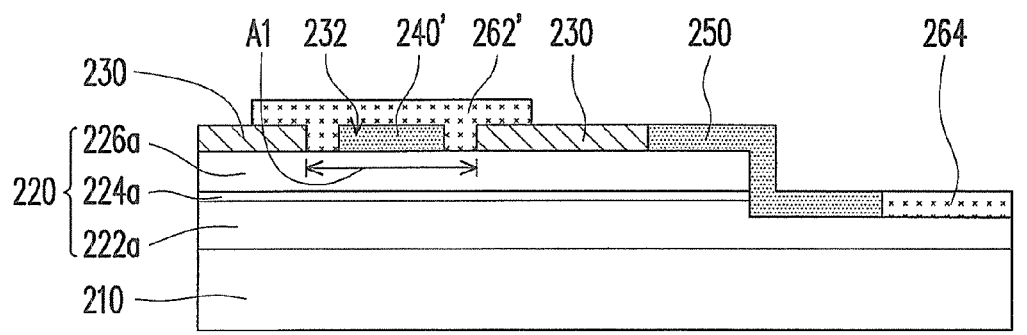

FIGS. 3A to 3B schematically illustrate cross-sectional views of a fabricating process of a light emitting diode chip according to another mode of embodiment of the present invention. Firstly, a light emitting diode chip 200a formed by the fabricating steps as shown by FIGS. 2A to 2C is provided and the relevant description thereof is not reiterated herein.

In detail, when the light emitting diode chip 200 is emitting the light, the current blocking layer 240 and the current spreading layer 230 can distribute the current evenly, so that the light emitting layer 224a emits a more even light. Furthermore, the passivation layer 250 is suitable for preventing the semiconductor device layer 220 from being damaged or oxidized by influences of the exterior environment and then enhancing electrical characteristics of the light emitting diode chip 200 when driven.

Similarly, upon completion of the foregoing steps, a first electrode 262' is formed on the current blocking layer 240', the current spreading layer 230, and a portion of the second type semiconductor device layer 226a. Furthermore, the second electrode 264 is formed on the semiconductor device layer 220, as illustrated by FIG. 3B. In the present embodiment, the first electrode 262' and the second electrode 264 are formed, for example, by the method of fabricating the first electrode 262 and the second electrode 264, and the method is thus not reiterated herein. It should be noted that since the current blocking layer 240' is different from the current blocking layer 240, the first electrode 262' is directly connected to a portion of the second type semiconductor device layer 226a that is exposed by the opening 232 but not covered by the current blocking layer 240, as shown in FIG. 3B.

In the present embodiment, the fabricating steps of the light emitting diode chip 200a are substantially the same as those of the light emitting diode chip 200, and the difference is the designs of the mask patterns of the current blocking layer 240' and the mask patterns of the current blocking layer 240. In other words, the fabricating method of the light emitting diode chip 200a also reduces the fabrication steps, cost, and time.

The Second Embodiment

Figure 4A:
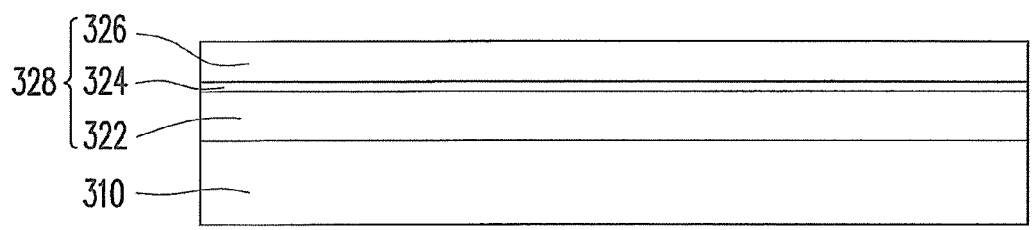
FIGS. 4A through 4F schematically illustrate cross-sectional views of a fabricating process of a light emitting diode chip according to a second embodiment of the present invention.

FIGS. 4A through 4F schematically illustrate cross-sectional views of a fabricating process of a light emitting diode chip according to a second embodiment of the present invention. Firstly, a first type semiconductor material layer 322, a light emitting material layer 324, and a second type semiconductor material layer 326 are sequentially formed on a substrate 310 to form a semiconductor layer 328, as illustrated by FIG. 4A. In the present embodiment, the steps of fabricating the semiconductor layer 328 on the substrate 310 are the same as those of fabricating the semiconductor layer 228 on the substrate 210 (shown in the first embodiment), for example. Thus, a relevant description can be referred to the foregoing embodiment, and is not reiterated herein. Moreover, a material of the substrate 310 is, for example, a material described for the substrate 210. The material layers 322, 324, and 326 are the same as the material layers 222, 224, and 226 of the previous embodiment. Thus, a relevant description is omitted herein.

Figure 4B:
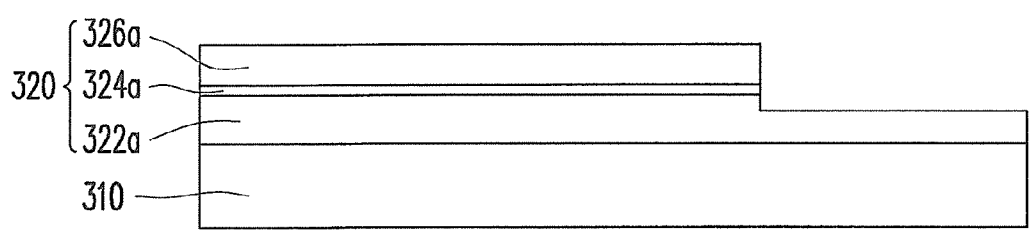

Afterwards, the semiconductor layer 328 is patterned to form a semiconductor device layer 320, as illustrated in FIG. 4B. In the present embodiment, the semiconductor device layer 320 is formed, for example, by a conventional photolithography and etching process (PEP). Upon the completion of the foregoing process of fabricating the semiconductor layer 328, the second type semiconductor material layer 326, the light emitting material layer 324, and the first type semiconductor material layer 322 are patterned by the PEP to form a first type semiconductor device layer 322a, a light emitting device layer 324a, and a second type semiconductor device layer 326a, as illustrated in FIG. 4B. The light emitting device layer 324a is disposed on a portion of the first type semiconductor device layer 322a, and the second type semiconductor device layer 326a is disposed on the light emitting device layer 324a.

Figure 4C:
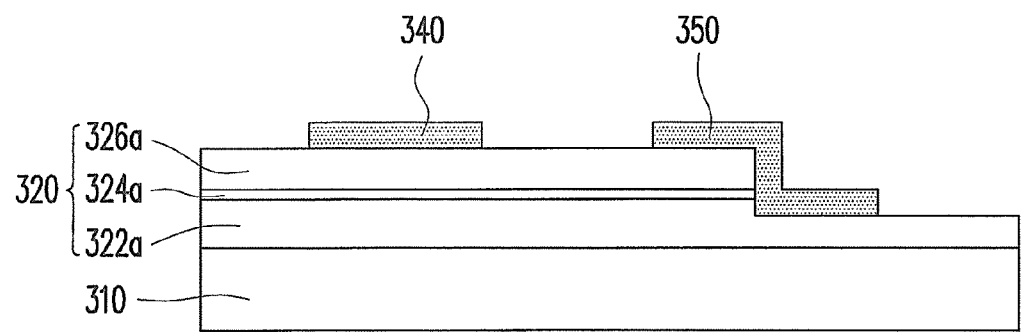

Then, a current blocking layer 340 and a passivation layer 350 are formed simultaneously on a portion of the semiconductor device layer 320, as shown in FIG. 4C. In the present embodiment, the current blocking layer 340 and the passivation layer 350 are formed, for example, by forming a dielectric layer (not shown) entirely on the semiconductor device layer 320. Afterwards, the dielectric layer is patterned by the conventional PEP, so as to form the current blocking layer 340 and the passivation layer 350 simultaneously as shown in FIG. 4C.

In addition, the dielectric layer is formed, for example, by a plasma enhanced chemical vapor deposition (PECVD) process, but the present embodiment is not limited thereto. Other suitable processes may also be used, such as a screen printing process, a coating process, or an inkjet printing process. Similarly, in the present embodiment, the dielectric layer may be a single-layered or a multi-layered structure, and a material of the dielectric layer is, for example, the material used for fabricating the current blocking layer 240 and the passivation layer 250. Hence, a relevant illustration can be referred to the foregoing embodiment, and is not reiterated herein.

Figure 4D:
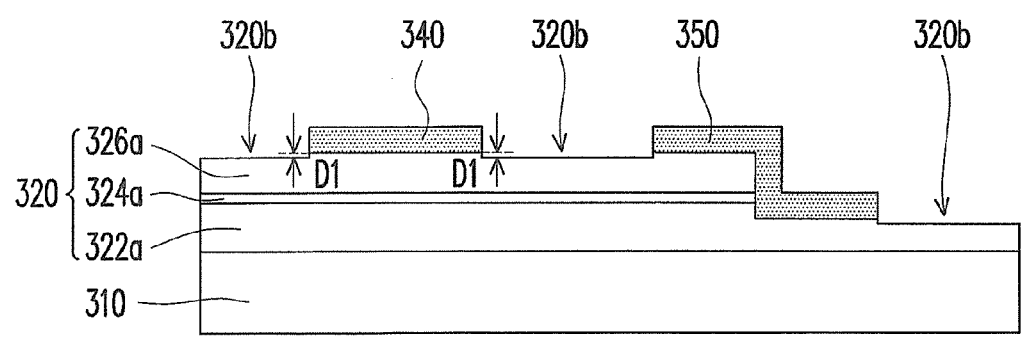

Afterwards, the current blocking layer 340 and the passivation layer 350 are used as a mask to remove a portion of the semiconductor device layer 320 not covered by the current blocking layer 340 and the passivation layer 350, so as to form a plurality of identification recesses 320b on the semiconductor device layer 320, as illustrated in FIG. 4D. In the present embodiment, the identification recesses are formed, for example, by an etching process. The etching process thereof is dry-etching or other suitable etching processes, for example. Moreover, the identification recesses 320b formed by the etching process have a depth D1 that principally does not affect normal operation of the semiconductor device. In general, the depth D1 of the identification recesses 320b is usually smaller than a thickness of the second type semiconductor layer 326a.

Figure 4E:
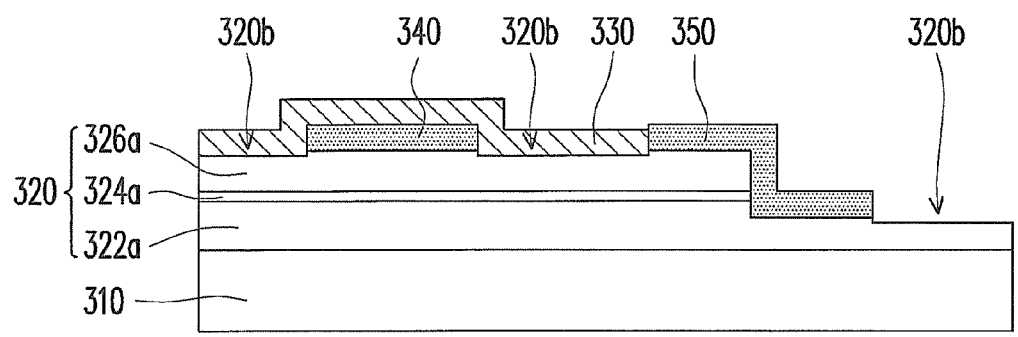

Next, a current spreading layer 330 is formed on the current blocking layer 340 and a portion of the semiconductor device layer 320, as shown in FIG. 4E. In the present embodiment, the current spreading layer 330 is formed, for example, by the conventional PEP. In an embodiment of the present invention, upon completion of the foregoing steps, a conductive layer (not shown) is formed entirely on the second type semiconductor device layer 326a. Then, the conductive layer is patterned to form the current spreading layer 330 as illustrated in FIG. 4E. In the present embodiment, the identification recesses 320b are formed on the semiconductor device layer 320. Since the second type semiconductor device layer 326a and the current blocking layer 340 are films of different materials, the identification recesses 320b and surrounding films that are not recessed will have a color contrast, which facilitates an alignment of different PEPs. Herein, the current blocking layer 340 is usually a transparent material and the second type semiconductor layer 325a is a semiconductor material. Moreover, a material of the current spreading layer 330 of the present embodiment is exemplified by an indium tin oxide. In other embodiments, the material of the current spreading layer 330 may also be materials mentioned in the current spreading layer 230. Therefore, a relevant illustration can be referred to the foregoing embodiments, and is not repeated here.

Figure 4F:
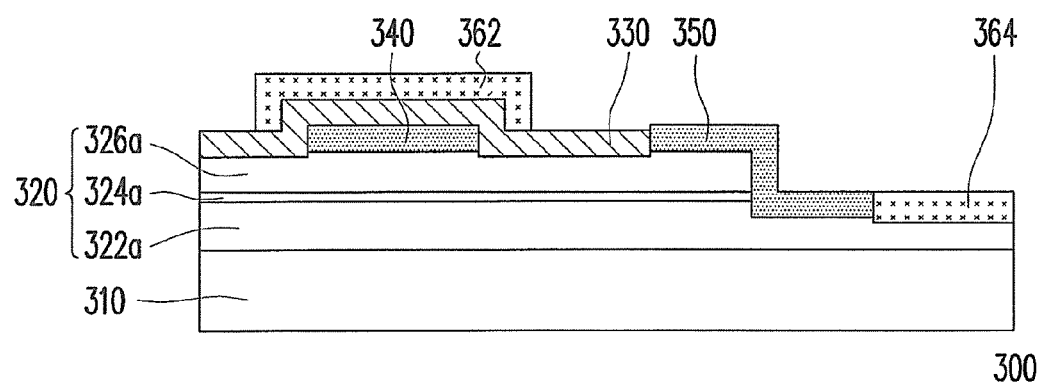

Next, a first electrode 362 is formed on the current spreading layer 330 and a second electrode 364 is formed on the semiconductor device layer 320, as illustrated by FIG. 4F. In the present embodiment, the first electrode 362 and the second electrode 364 are formed, for example, by the conventional PEP. In an embodiment of the present invention, a patterned photoresist layer (not shown) can be first formed on the current spreading layer 330, the passivation layer 350, and the semiconductor device layer 320. Afterwards, an electrode material layer (not shown) is formed entirely on the substrate 310. Then, the patterned photoresist layer is removed, such that the electrode material layer on the patterned photoresist layer is also removed to form the first electrode 362 and the second electrode 364 as shown in FIG. 4F. Up to this point, the process of fabricating a light emitting diode chip 300 is generally completed.

In the present embodiment, the steps of fabricating the light emitting diode chip 300 mainly use the PEP to fabricate the current blocking layer 340 and the passivation layer 350 simultaneously, such that the fabricating steps can be reduced to minimize the fabrication cost and the fabrication time of the light emitting diode chip 300 effectively. Moreover, as the identification recesses 320b are formed on the semiconductor device layer 320, an easier alignment process may be performed when forming the current spreading layer 330. Moreover, as the silicon carbide based material is applied in the current blocking layer 340, the current blocking layer 340 will not be easily eroded by a BOE process with the use of HF, etc. Thus, the fabricating process has a better reliability.

Figure 5A:
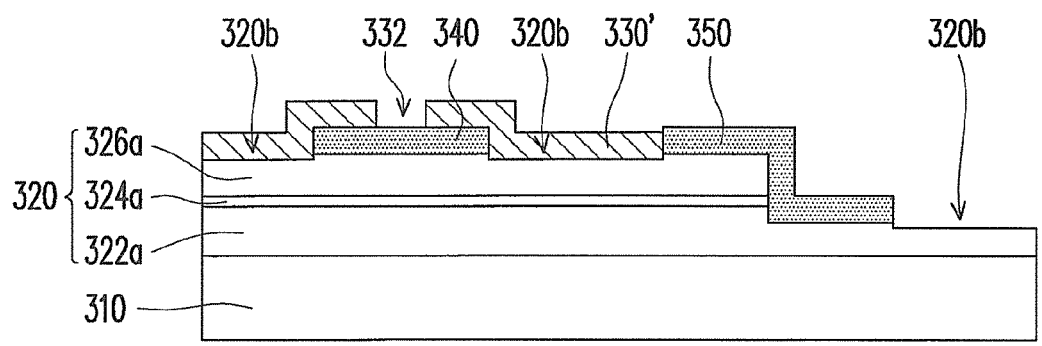
FIGS. 5A to 5B schematically illustrate cross-sectional views of a fabricating process of a light emitting diode chip according to another mode of embodiment of the present invention.
Figure 5B:
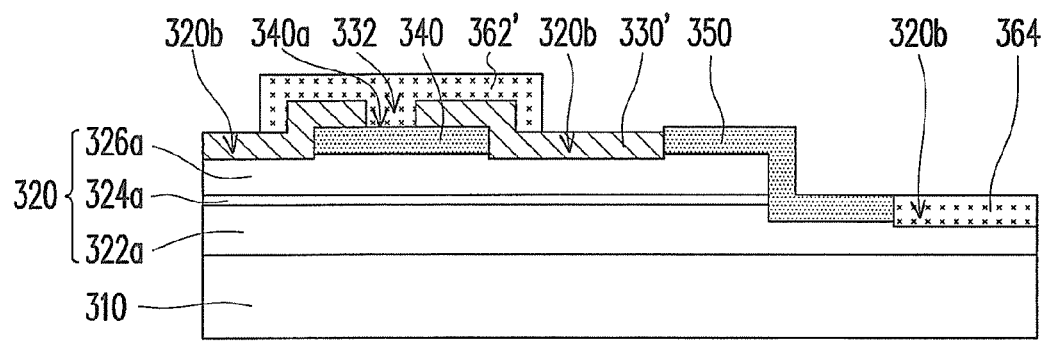

FIGS. 5A to 5B schematically illustrate cross-sectional views of a fabricating process of a light emitting diode chip according to another mode of embodiment of the present invention. Firstly, a light emitting diode chip 300a is formed by first applying the fabricating steps as shown by FIGS. 4A to 4D. Thus, a relevant description thereof is not reiterated herein.

Upon completion of the foregoing steps, a current spreading layer 330' is formed on the current blocking layer 340 and a portion of the semiconductor device layer 320, as shown in FIG. 5A. In the present embodiment, the current spreading layer 330' is formed, for example, by using the method of forming the current spreading layer 330. Therefore, a relevant process can be referred to the foregoing and is omitted here. The only difference between the two methods is that the current spreading layer 330' is formed by adjusting mask patterns, such that the current spreading layer 330'has an opening 332, which then exposes an upper surface 340a of the current blocking layer 340. Herein, a shape of the opening 332 can be a circular opening, an annular opening, or openings in other shapes. In other words, the current spreading layer 330' is formed merely by adjusting the mask patterns rather than providing additional exposure development processes.

Similarly, after the foregoing steps have been completed, a first electrode 362' is formed on the current spreading layer 330', and the second electrode 364 is formed on the semiconductor device layer 320, as illustrated by FIG. 5B. In the present embodiment, the first electrode 362' and the second electrode 364 are formed, for example, by the method of fabricating the first electrode 362 and the second electrode 364, thus the method is not reiterated herein. It should be noted that since the current spreading layer 330' has the opening 332, when the first electrode 362' is formed on the current spreading layer 330, the first electrode 362' will contact with the upper surface 340a of the current blocking layer 340 through the opening 332 as illustrated in FIG. 5B. Up to this point, the process of fabricating the light emitting diode chip 300a is generally completed.

In the present embodiment, the fabricating steps of the light emitting diode chip 300a are the same as those of the light emitting diode chip 300, and the only slight difference exists in the designs of the mask patterns of the current spreading layer 330' and the mask patterns of the current spreading layer 330. In other words, the fabricating steps of the light emitting diode chip 300a have the same advantages as those described in the fabricating of light emitting diode chip 300.

The Third Embodiment

Figure 6A:
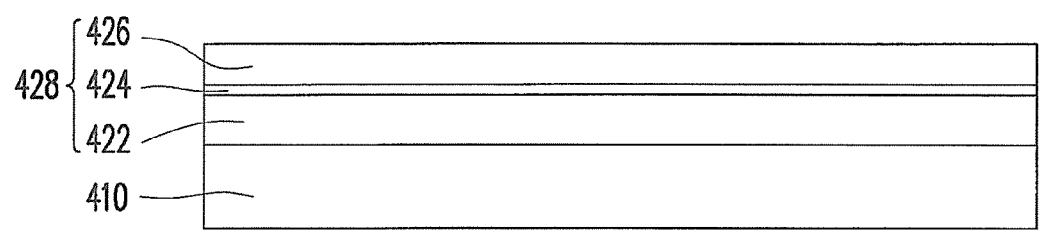
FIGS. 6A through 6E schematically illustrate cross-sectional views of a fabricating process of a light emitting diode chip according to a third embodiment of the present invention.

FIGS. 6A through 6E schematically illustrate cross-sectional views of a fabricating process of a light emitting diode chip according to a third embodiment of the present invention. Firstly, a first type semiconductor material layer 422, a light emitting material layer 424, and a second type semiconductor material layer 426 are sequentially formed on a substrate 410 to form a semiconductor layer 428, as illustrated by FIG. 6A. The steps of fabricating the semiconductor layer 428 on the substrate 410 are the same as those of fabricating the semiconductor layer 228 on the substrate 210, for example. Hence, a relevant description can be referred to the foregoing embodiments, and is not reiterated herein. Moreover, a material of the substrate 410 is, for example, a material described for the substrate 210. The material layers 422, 424, and 426 are the same as the material layers 222, 224, and 226 of the foregoing embodiments. Thus, a relevant description is not repeated herein.

Figure 6B:
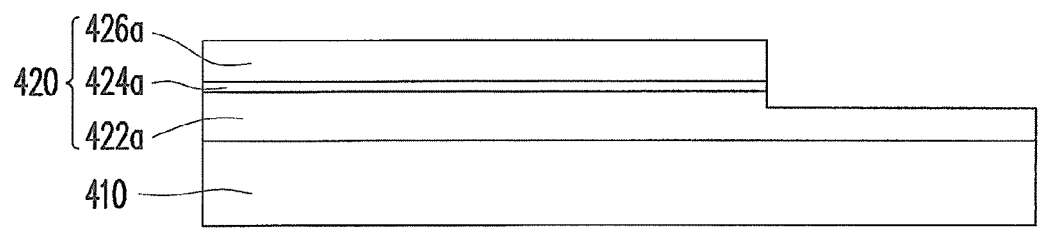

Afterwards, the semiconductor layer 428 is patterned to form a semiconductor device layer 420, as illustrated in FIG. 6B. In the present embodiment, the semiconductor device layer 420 is formed, for example, by a conventional photolithography and etching process (PEP). Upon the completion of the foregoing process of fabricating the semiconductor layer 428, the second type semiconductor material layer 426, the light emitting material layer 424, and the first type semiconductor material layer 422 are patterned by the PEP to form a first type semiconductor device layer 422a, a light emitting device layer 424a, and a second type semiconductor device layer 426a, as illustrated in FIG. 6B. The light emitting device layer 424a is disposed on a portion of the first type semiconductor device layer 422a, and the second type semiconductor device layer 426a is disposed on the light emitting device layer 424a. Up to this point, the steps of fabricating the semiconductor device layer 420 are generally completed.

Figure 6C:
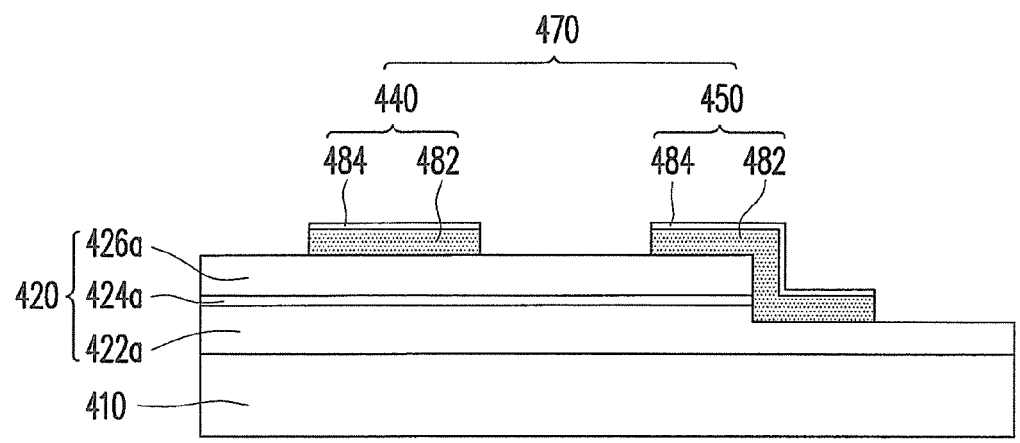

Thereafter, a patterned functional layer with multi-layer structure 470 is formed simultaneously on a portion of the semiconductor device layer 420 as illustrated in FIG. 6C. In the present embodiment, the patterned functional layer 470 is formed, for example, by forming a first dielectric layer 482 entirely on the semiconductor device layer 420. Then, an alignment identification layer 484 is formed entirely on the first dielectric layer 482. Finally, the first dielectric layer 482 and the alignment identification layer 484 are patterned by the PEP to form a current blocking layer 440 and a passivation layer 450 simultaneously as shown in FIG. 6C. In other words, the patterned functional layer 470 of the present embodiment mainly uses the PEP to form the current blocking layer 440 and the passivation layer 450 simultaneously and further reduce the fabricating steps.

In addition, the alignment identification layer 484 is, for example, the metal of at least one of gold, silver, copper, tin, lead, hafnium, tungsten, molybdenum, neodymium, titanium, tantalum, aluminum, zinc, etc. Furthermore, the first dielectric layer 482 is, for example, a transparent dielectric material of a silicon carbide based material, etc. Herein, the silicon carbide based material is $SiO_xC_y$: H, SiC, $SiC_xN_y$, or $SiO_xC_yN_z$, for example. Hence, the current blocking layer 440 and the passivation layer 450 formed by the films 482 and 484 can be identified by a color of the alignment identification layer 484 to further increase the convenience and accuracy of alignment in the following process. In other embodiments, the first dielectric layer 482 can also be a material used to form the current blocking layer 240 and the passivation layer 250. As a result, a relevant description can be referred to the foregoing embodiments and is omitted here.

Figure 6D:
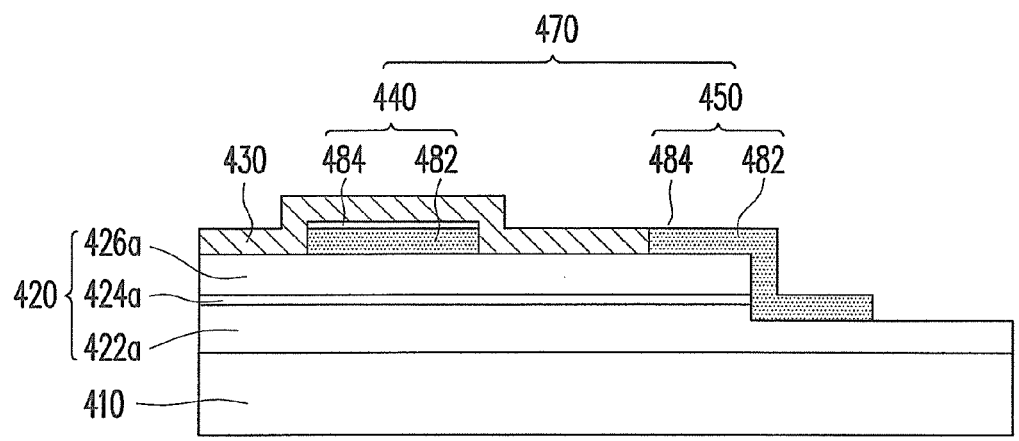

Upon completion of the steps aforementioned, a current spreading layer 430 is formed on a portion of the patterned functional layer 470 and a portion of the semiconductor device layer 420. Next, a portion of the patterned functional layer 470 not covered by the current spreading layer 430 is removed, as illustrated in FIG. 6D. In the present embodiment, the current spreading layer 430 is formed, for example, by the conventional PEP. In an embodiment of the present invention, a conductive layer (not shown) is formed entirely on the second type semiconductor device layer 426a and the current blocking layer 440. Herein, the current blocking layer 440 is, for example, a portion of the patterned functional layer 470 aforementioned. Afterwards, the conductive layer is patterned by the PEP to form the current spreading layer 430, as shown by FIG. 6D. On the other hand, to prevent a short circuit from occurring between the alignment identification layer 484 on the passivation layer 450 and a subsequently formed electrode structure, the etching process is performed to remove the alignment identification layer 484 on the passivation layer 450, as shown in FIG. 6D. Additionally, a material of the current spreading layer 430 of the present embodiment is exemplified by an indium tin oxide. In other embodiments, the material of the current spreading layer 430 may also be materials mentioned in the current spreading layer 230. Thus, a relevant illustration can be referred to the foregoing embodiments and is not reiterated herein.

Figure 6E:
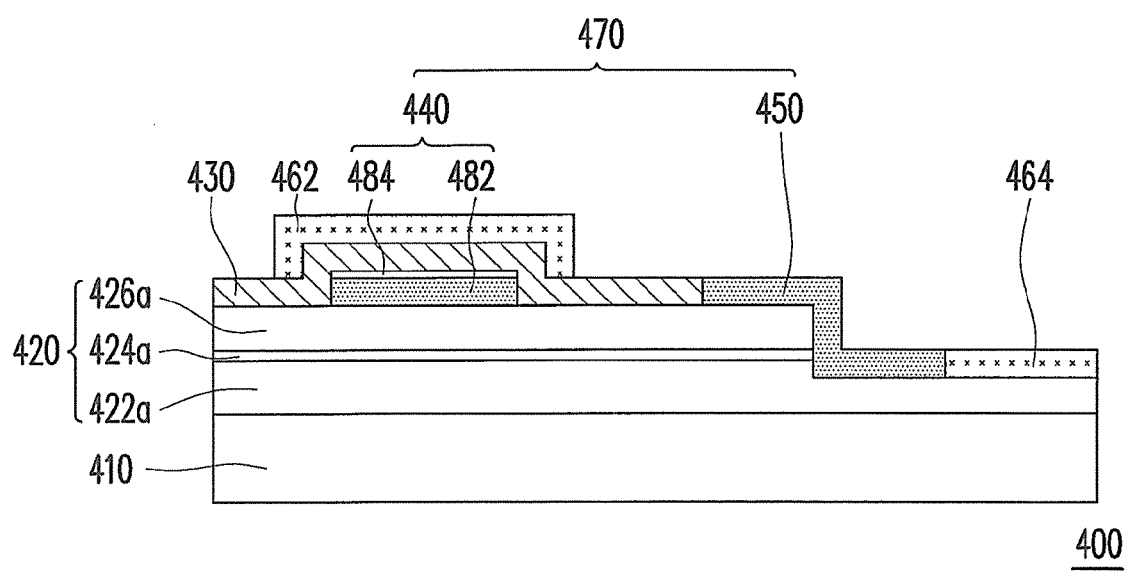

Next, as shown in FIG. 6E, a first electrode 462 is formed on the current spreading layer 430 and a second electrode 464 is formed on the semiconductor device layer 420. In the present embodiment, the first electrode 462 and the second electrode 464 are formed, for example, by the conventional PEP. In an embodiment of the present invention, a patterned photoresist layer (not shown) can be first formed on the current spreading layer 430 and the semiconductor device layer 420. Afterwards, an electrode material layer (not shown) is formed entirely on the substrate 410. Then, the patterned photoresist layer is removed, such that the electrode material layer on the patterned photoresist layer is also removed to form the first electrode 462 and the second electrode 464 as shown in FIG. 6E. Up to this point, the process of fabricating a light emitting diode chip 400 is generally completed.

In light of the foregoing, the steps of fabricating the light emitting diode chip 400 mainly form the first dielectric layer 482 and the alignment identification layer 484 entirely, and then fabricate the current blocking layer 440 and the passivation layer 450 simultaneously by the PEP. Hence, the method of fabricating the light emitting diode chip 400 not only reduces the fabrication steps, cost, and time, but also allows the current blocking layer 440 and the passivation layer 450 to have a better identity. As a consequence, the fabricating method can be used as an identification tool for the alignment to increase the alignment accuracy in the following fabricating steps. Similarly, when the silicon carbide based material is applied in the current blocking layer 440, the current blocking layer 440 will not be easily eroded by a BOE process with the use of HF, etc. Thus, the fabricating process has a better reliability.

Figure 7A:
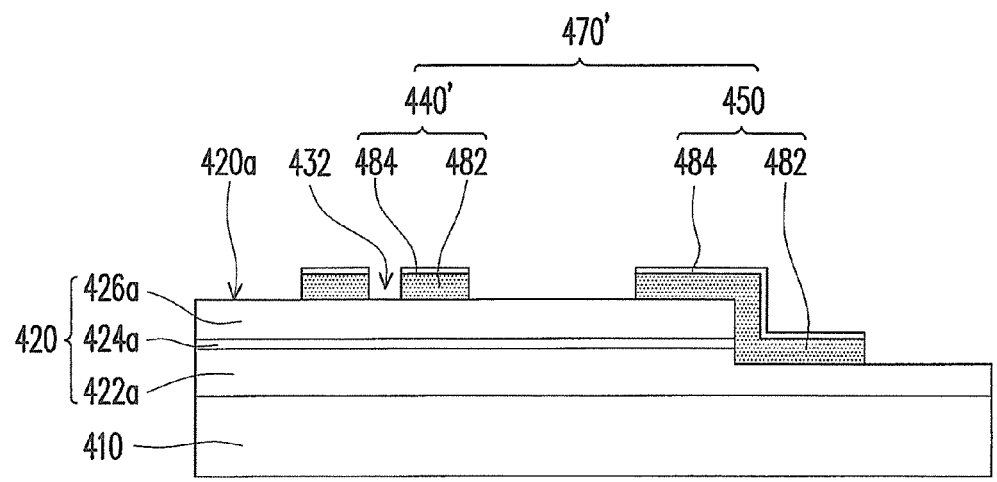
FIGS. 7A to 7C schematically illustrate cross-sectional views of a fabricating process of a light emitting diode chip according to another mode of embodiment of the present invention.
Figure 7B:
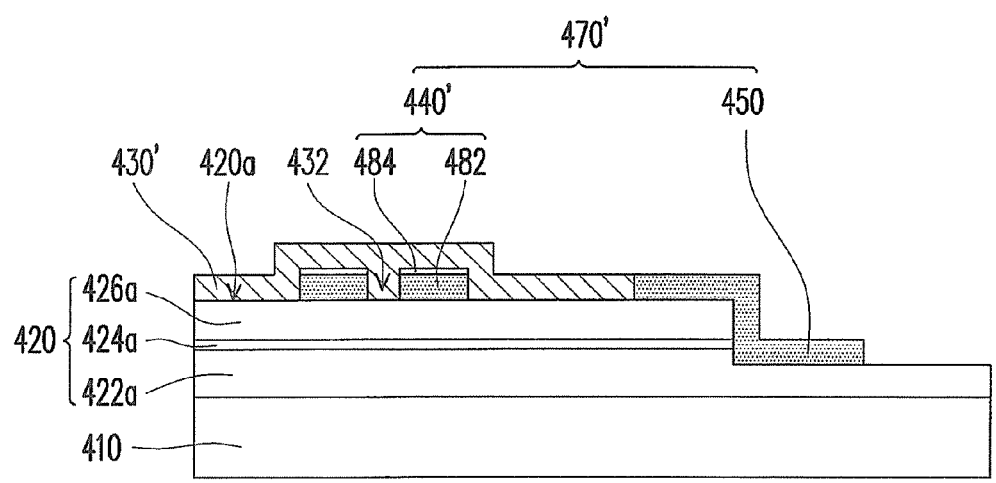
Figure 7C:
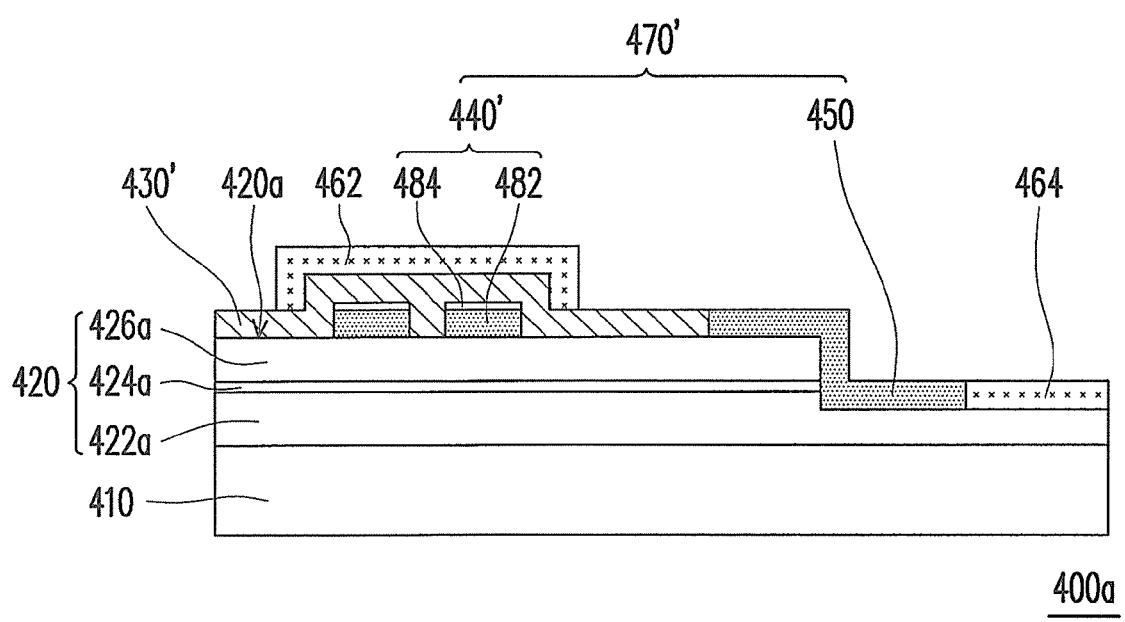

FIGS. 7A to 7C schematically illustrate cross-sectional views of a fabricating process of a light emitting diode chip according to another mode of embodiment of the present invention. Firstly, a light emitting diode chip 400a is formed by first applying the fabricating steps as shown by FIGS. 6A to 6B. Consequently, a relevant description thereof is omitted here.

Next, a patterned functional layer 470' with multi-layer structure is formed simultaneously on a portion of the semiconductor device layer 420 as illustrated in FIG. 7A. In the present embodiment, the patterned functional layer 470' is formed, for example, by the method of forming the patterned functional layer 470. Therefore, a relevant description can be referred to the foregoing. The only difference between the two methods is that designs of mask patterns of a current blocking layer 440' are different from that of the current blocking layer 440. Therefore, after the first dielectric layer 482 and the alignment identification layer 484 are patterned by the PEP, the current blocking layer 440' will have an opening 432 to expose an upper surface 420a of the second type semiconductor layer 426a, as shown in FIG. 7A. In the present embodiment, the patterned functional layer 470' also has the same advantages as that of the patterned functional layer 470 does, and a relevant description thereof is thus omitted.

Then, a current spreading layer 430' is formed on a portion of the patterned functional layer 470' and a portion of the semiconductor device layer 420'. Next, a portion of the patterned functional layer 470' not covered by the current spreading layer 430' is removed, as illustrated in FIG. 7B. In the present embodiment, the current spreading layer 430' is formed, for example, by using the method of forming the current spreading layer 430. Therefore, a relevant illustration can be referred to the foregoing and is not reiterated herein. Similarly, to prevent short circuit from occurring between the alignment identification layer 484 on the passivation layer 450 and the electrode structure subsequently formed, the etching process is performed to remove the alignment identification layer 484 on the passivation layer 450, as shown in FIG. 7B. It should be noted that as the current blocking layer 440' has the opening 432, when the current spreading layer 430' is formed on a portion of the patterned functional layer 470 and a portion of the semiconductor device layer 420, the current spreading layer 430'will contact with the upper surface 420a of the second type semiconductor layer 426a through the opening 432, as shown in FIG. 7B.

Similarly, after the foregoing steps have been completed, the first electrode 462 is formed on the current spreading layer 430' and the second electrode 464 is formed on the semiconductor device layer 420, as illustrated by FIG. 7C. In the present embodiment, the first electrode 462 and the second electrode 464 are formed, for example, by the fabricating method mentioned above, thus the method is not reiterated herein. Up to this point, the process of fabricating the light emitting diode chip 400a is generally completed.

In the present embodiment, the fabricating method of the light emitting diode chip 400a is similar to that of the light emitting diode chip 400. The only difference between the two methods is that the current blocking layer 440' uses different mask pattern designs than those of the current blocking layer 440, such that the current blocking layer 440' has the opening 432. Consequently, the current spreading layer 430' will contact with the upper surface 420a of the second type semiconductor layer 426a through the opening 432. In other words, the method of fabricating the light emitting diode chip 400a also has the same advantages as that of the light emitting diode chip 400 does, and a relevant description thereof is thus omitted.

Figure 8A:
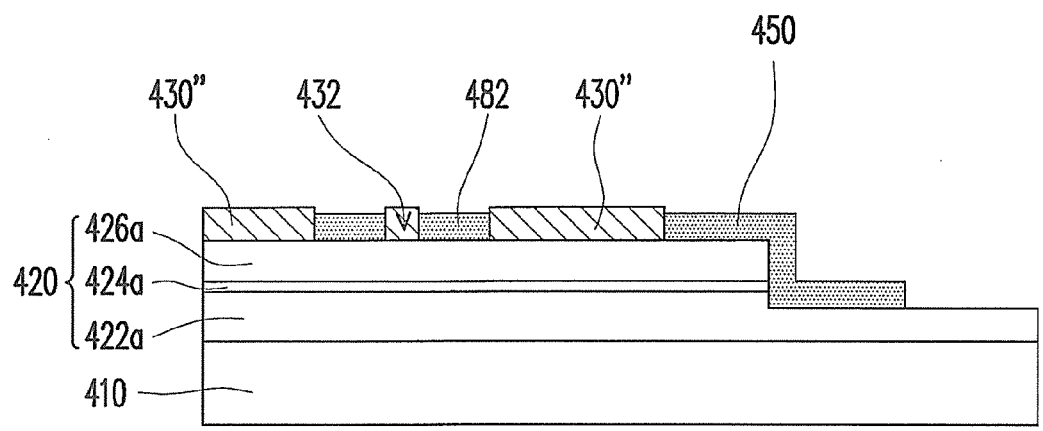
FIGS. 8A to 8B schematically illustrate cross-sectional views of a fabricating process of a light emitting diode chip according to another mode of embodiment of the present invention.
Figure 8B:
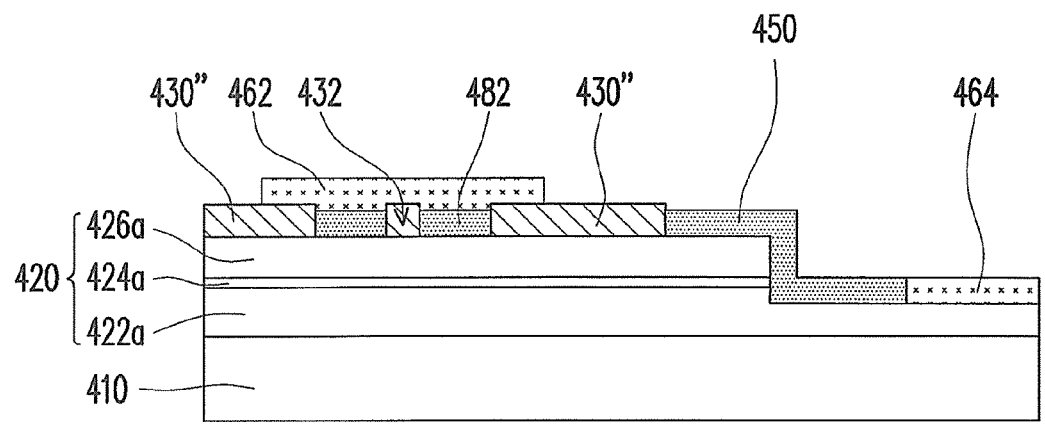

FIGS. 8A to 8B schematically illustrate cross-sectional views of a fabricating process of a light emitting diode chip according to another mode of embodiment of the present invention. Firstly, a light emitting diode chip 400b is formed by first applying the fabricating steps as shown by FIGS. 6A to 6B and FIG. 7A. Thus, a relevant description thereof is not repeated herein.

Then, a current spreading layer 430" is formed on a portion of the semiconductor device layer 420, and a portion of the patterned functional layer 470' not covered by the current spreading layer 430" is removed, as illustrated in FIG. 8A. In the present embodiment, the current spreading layer 430" is formed, for example, by using the method of forming the current spreading layer 430'. Moreover, a relevant illustration can be referred to the foregoing and is omitted herein. Here, the only difference between the current spreading layer 430" and the current spreading layer 430' is that mask patterns of different shapes are used. Furthermore, to prevent the short circuit from occurring between the alignment identification layer 484 and the subsequently formed electrode structure, the etching process is performed to remove the alignment identification layer 484, as shown in FIG. 8A. In the present embodiment, the first dielectric layer 482 (or the aforementioned current blocking layer 440') has the opening 432. As a result, when the current spreading layer 430" is formed on a portion of the semiconductor device layer 420, the current spreading layer 430" contacts with the upper surface 420a of the second type semiconductor layer 426a through the opening 432, as shown in FIG. 8A.

Upon completion of the foregoing steps, the first electrode 462 is formed on the current spreading layer 430" and a portion of the patterned functional layer 470', and the second electrode 464 is formed on the semiconductor device layer 420, as illustrated by FIG. 8B. In the present embodiment, the first electrode 462 and the second electrode 464 are formed, for example, by the fabricating method mentioned above, thus the method is not reiterated herein. Up to this step, the process of fabricating the light emitting diode chip 400b is generally completed.

Similarly, in the present embodiment, the method of fabricating the light emitting diode chip 400b is similar to that of the light emitting diode chip 400a. The only difference between the two methods is that the current spreading layer 430" and the current spreading layer 430' have different mask pattern designs. Hence, upon completion of the following electrode fabrication, the structure of the light emitting diode chip 400b will be different from that of the light emitting diode chip 400a. However, the light emitting diode chip 400b is formed by the fabricating steps of the light emitting diode chip 400a, except for the different designs of the mask patterns in some steps. As a result, the light emitting diode chip 400b also has the same advantages as that of the light emitting diode chips 400a and 400 do, and a relevant description thereof is thus omitted.

The Fourth Embodiment

Figure 9A:
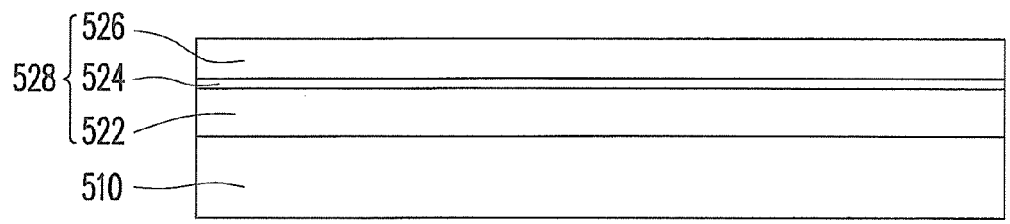
FIGS. 9A through 9E schematically illustrate cross-sectional views of a fabricating process of a light emitting diode chip according to a fourth embodiment of the present invention.

FIGS. 9A through 9E schematically illustrate cross-sectional views of a fabricating process of a light emitting diode chip according to a fourth embodiment of the present invention. Firstly, a first type semiconductor material layer 522, a light emitting material layer 524, and a second type semiconductor material layer 526 are sequentially formed on a substrate 510 to form a semiconductor layer 528, as illustrated by FIG. 9A. The steps of fabricating the semiconductor layer 528 on the substrate 510 are the same as those of fabricating the semiconductor layer 228 on the substrate 210, for example. Thus, a relevant description can be referred to the foregoing embodiments, and is not reiterated herein. Moreover, a material of the substrate 510 is, for example, a material described for the substrate 210. The material layers 522, 524, and 526 are the same as the material layers 222, 224, and 226 of the foregoing embodiments. Thus, a relevant description is not repeated herein.

Figure 9B:
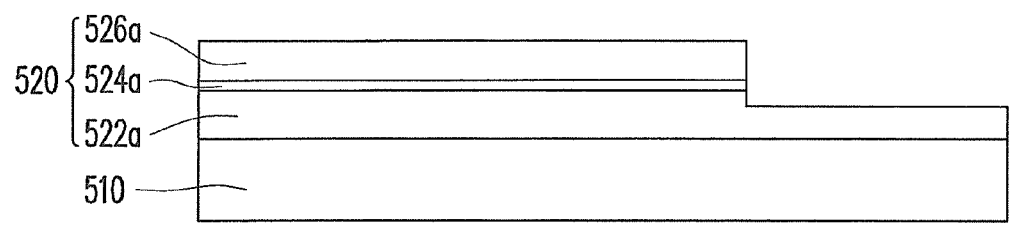

Afterwards, the semiconductor layer 528 is patterned to form a semiconductor device layer 520, as illustrated in FIG. 9B. In the present embodiment, the semiconductor device layer 520 is formed, for example, by a conventional photolithography and etching process (PEP). Upon the completion of the foregoing process of fabricating the semiconductor layer 528, the second type semiconductor material layer 526, the light emitting material layer 524, and the first type semiconductor material layer 522 are patterned by the PEP to form a first type semiconductor device layer 522a, a light emitting device layer 524a, and a second type semiconductor layer device 526a, as illustrated in FIG. 9B. The light emitting layer 524a is disposed on a portion of the first type semiconductor device layer 522a, and the second type semiconductor layer 526a is disposed on the light emitting layer device 524a. Up to this point, the steps of fabricating the semiconductor device layer 520 are generally completed.

Figure 9C:
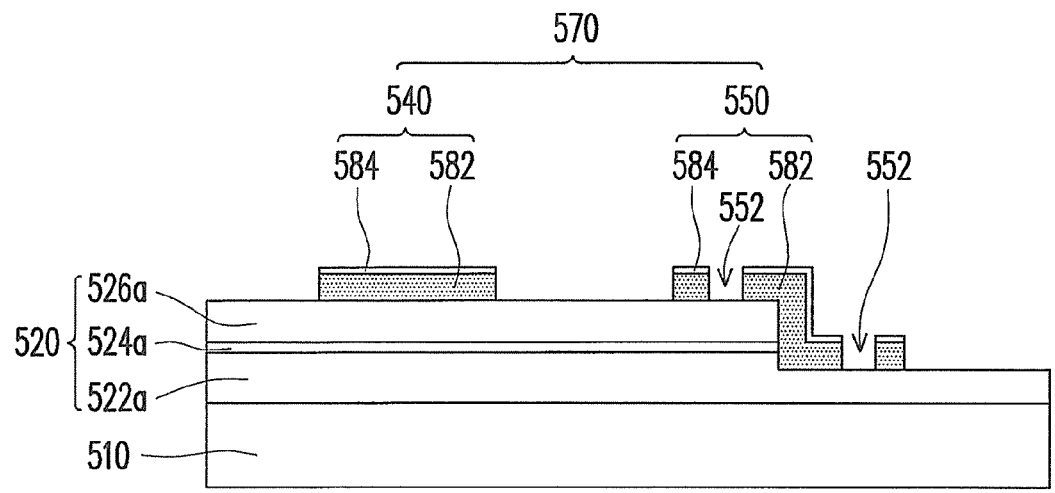
Figure 9D:
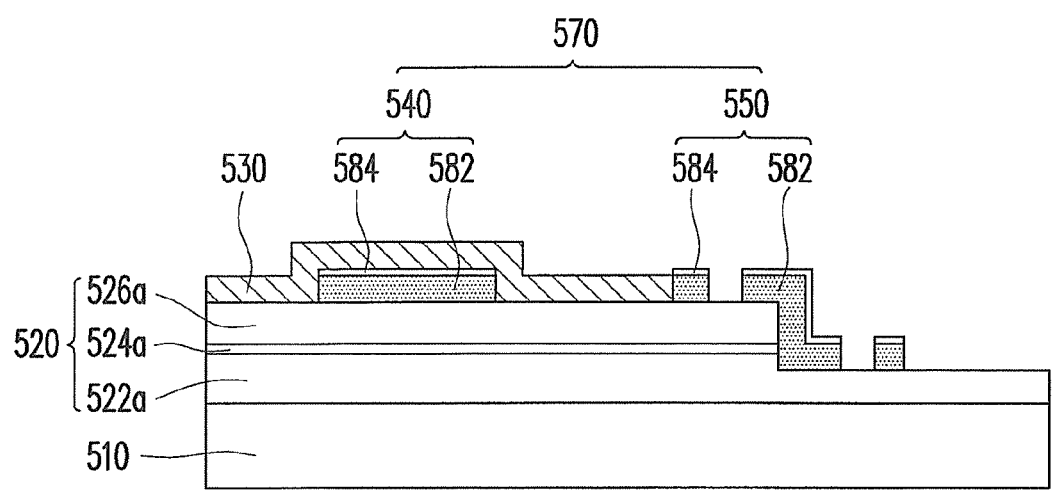

Next, a patterned functional layer 570 with multi-layer structure is formed simultaneously on a portion of the semiconductor device layer 520 as illustrate in FIG. 9C. In the present embodiment, the patterned functional layer 570 is formed, for example, by forming a first dielectric layer 582 entirely on the semiconductor device layer 520. Then, an alignment identification layer 584 is formed entirely on the first dielectric layer 582. Finally, the first dielectric layer 582 and the alignment identification layer 584 are patterned by the PEP to form a current blocking layer 540, a passivation layer 550, and an isolating trench 552 disposed within the passivation layer 550 simultaneously, as shown in FIG. 9C. In detail, the patterned functional layer 570 of the present embodiment mainly uses the PEP to form the current blocking layer 540 and the passivation layer 550 simultaneously to reduce the fabricating steps. Besides, the patterned functional layer 570 has the isolating trench 552 as shown in FIG. 9C. Thus, when fabricating a following electrode structure, a short circuit can be prevented from occurring between electrodes.

In the present embodiment, a material of the alignment identification layer 584 is, for example, the material described for the alignment identification layer 484 in the previous embodiment. In addition, a material of the first dielectric layer 582 is, for example, the material mentioned for the first electrode layer 482 in the previous embodiment. Thus, a relevant illustration can be referred to the foregoing and is not repeated herein. Hence, the current blocking layer 540 and the passivation layer 550 formed by the films 582 and 584 can be identified by a color of the alignment identification layer 584 so that an alignment in the following fabricating process may be performed conveniently.

Afterwards, the semiconductor layer 528 is patterned to form a semiconductor device layer 520, as illustrated in FIG. 9B. In the present embodiment, the semiconductor device layer 520 is formed, for example, by a conventional photolithography and etching process (PEP). Upon the completion of the foregoing process of fabricating the semiconductor layer 528, the second type semiconductor material layer 526, the light emitting material layer 524, and the first type semiconductor material layer 522 are patterned by the PEP to form a first type semiconductor device layer 522a, a light emitting device layer 524a, and a second type semiconductor layer device 526a, as illustrated in FIG. 9B. The light emitting device layer 524a is disposed on a portion of the first type semiconductor device layer 522a, and the second type semiconductor layer 526a is disposed on the light emitting device layer 524a. Up to this point, the steps of fabricating the semiconductor device layer 520 are generally completed.

Figure 9E:
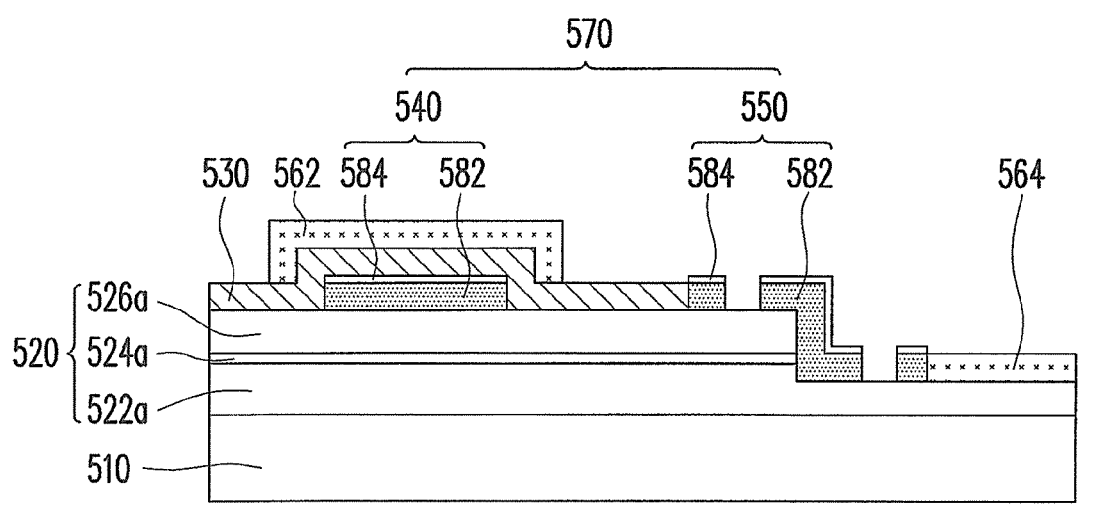

Next, a first electrode 562 is formed on the current spreading layer 530 and a second electrode 564 is formed on the semiconductor device layer 520. In the present embodiment, the first electrode 562 and the second electrode 564 are formed, for example, by the conventional PEP. In an embodiment of the present invention, a patterned photoresist layer (not shown) can be first formed on the current spreading layer 530 and the semiconductor device layer 520. Afterwards, an electrode material layer (not shown) is formed entirely on the substrate 510. Then, the patterned photoresist layer is removed, such that the electrode material layer on the patterned photoresist layer is also removed to form the first electrode 562 and the second electrode 564 as shown in FIG. 9E. It should be noted that one or more isolating trench 552 is spaced between the second electrode 564 and the first electrode 562 to prevent the first electrode 562 from being electrically connected to the second electrode 564 so as to result in the short circuit. Up to this point, the process of fabricating a light emitting diode chip 500 is generally completed.

In light of the foregoing, the steps of fabricating the light emitting diode chip 500 mainly form the first dielectric layer 582 and the alignment identification layer 584 entirely, and then fabricate the current blocking layer 540, the passivation layer 550, and the isolating trench 552 simultaneously by the PEP. Hence, the method of fabricating the light emitting diode chip 500 not only reduces the fabrication steps, cost, and time, but also prevents the short circuit that results from the electrical connection between electrodes during the following fabrication of an electrode structure. Besides, the current blocking layer 540 and the passivation layer 550 are composed of the first dielectric layer 582 and the alignment identification layer 584. Thus, the current blocking layer 540 and the passivation layer 550 can have better identity used as an identification tool for alignment to increase the alignment accuracy in the following process. Similarly, as the silicon carbide based material is applied in the current blocking layer 540, the current blocking layer 540 will not be easily eroded by a BOE process with the use of HF, etc. Thus, the fabricating process has a better reliability.

Figure 10A:
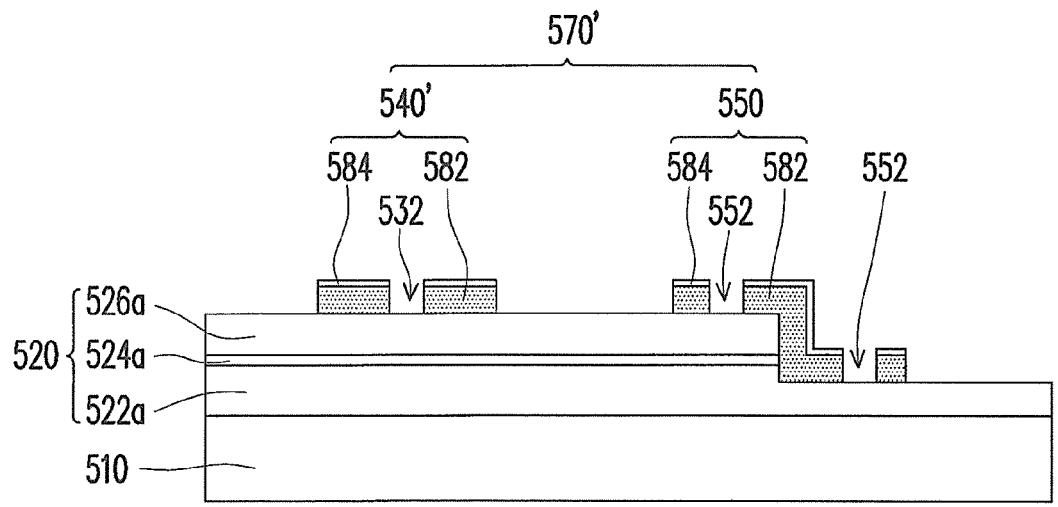
FIGS. 10A to 10C schematically illustrate cross-sectional views of a fabricating process of a light emitting diode chip according to another mode of embodiment of the present invention.
Figure 10B:
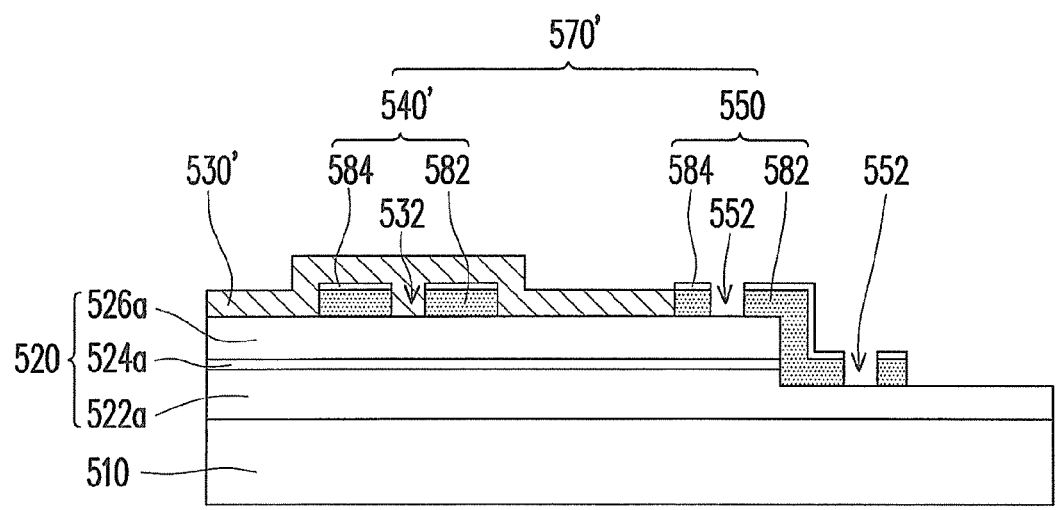
Figure 10C:
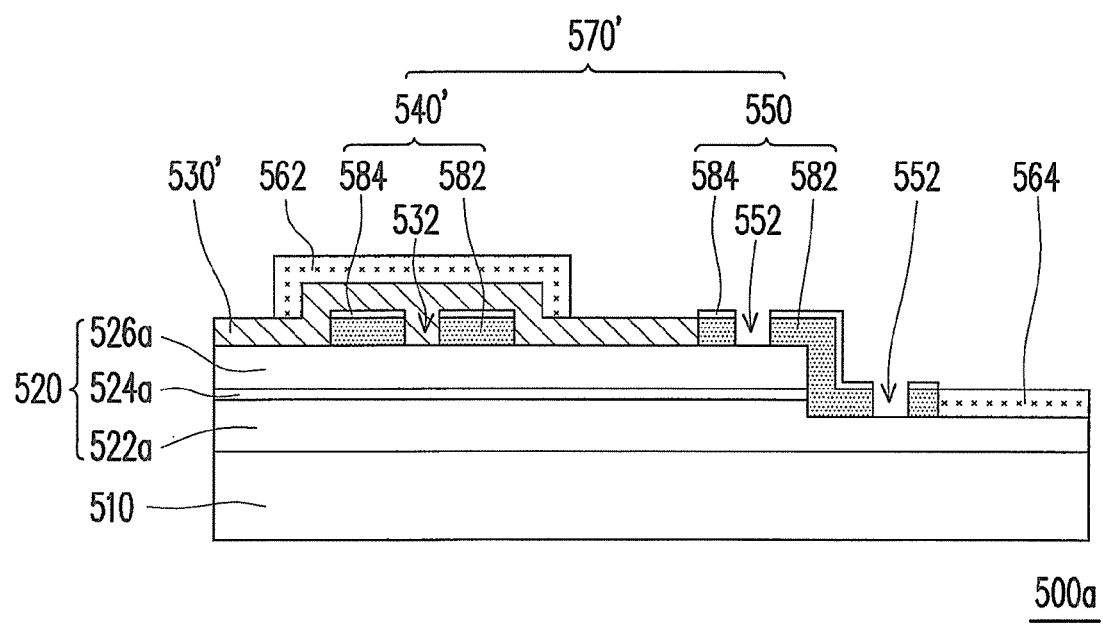

FIGS. 10A to 10C schematically illustrate cross-sectional views of a fabricating process of a light emitting diode chip according to another mode of embodiment of the present invention. Firstly, a light emitting diode chip 500a is formed by first applying the fabricating steps as shown by FIGS. 9A to 9B, and a relevant description thereof is not reiterated herein.

Next, a patterned functional layer 570' with multi-layer structure is formed simultaneously on a portion of the semiconductor device layer 520 as illustrate in FIG. 10A. In the present embodiment, the patterned functional layer 570' is formed, for example, by the method of forming the patterned functional layer 570. Therefore, a relevant description can be referred to the foregoing. The only difference between the two methods is that designs of mask patterns of a current blocking layer 540' are different from that of the current blocking layer 540. Therefore, after the first dielectric layer 582 and the alignment identification layer 584 are patterned by the PEP, the current blocking layer 540' will have an opening 532 to expose an upper surface 520a of the second type semiconductor layer 526a, as shown in FIG. 10A. In the present embodiment, the patterned functional layer 570' also has the same advantages as that of the patterned functional layer 570 does, and a relevant description thereof is thus omitted.

Thereafter, a current spreading layer 530' is formed on a portion of the patterned functional layer 570' and a portion of the semiconductor device layer 520 as illustrated by FIG. 10B. In the present embodiment, the current spreading layer 530' is formed, for example, by using the method of forming the current spreading layer 530. Here, a relevant illustration can be referred to the foregoing and is not repeated here. It should be noted that as the current blocking layer 540' has the opening 532, the current spreading layer 530' is formed on a portion of the patterned functional layer 570' and a portion of the semiconductor device layer 520. Hence, the current spreading layer 530' will contact with the upper surface 520a of the second type semiconductor device layer 526a through the opening 532, as shown in FIG. 10B.

Upon completion of the foregoing steps, the first electrode 562 is formed on the current spreading layer 530' and a second electrode 564 is formed on the semiconductor device layer 520, as illustrated by FIG. 10C. In the present embodiment, the first electrode 562 and the second electrode 564 are formed, for example, by the fabricating method mentioned above, thus the method is not reiterated herein. Up to this point, the process of fabricating the light emitting diode chip 500a is generally completed.

In the present embodiment, the fabricating method of the light emitting diode chip 500a is similar to that of the light emitting diode chip 500. However, the only difference between the two methods is that the current blocking layer 540' uses different mask pattern designs than those of the current blocking layer 540, such that the current blocking layer 540' has the opening 532. Consequently, the current spreading layer 530' will contact with the upper surface 520a of the second type semiconductor layer 526a through the opening 532. In other words, the method of fabricating the light emitting diode chip 500a also has the same advantages as that of the light emitting diode chip 500 does, and a relevant description thereof is thus omitted.

Figure 11A:
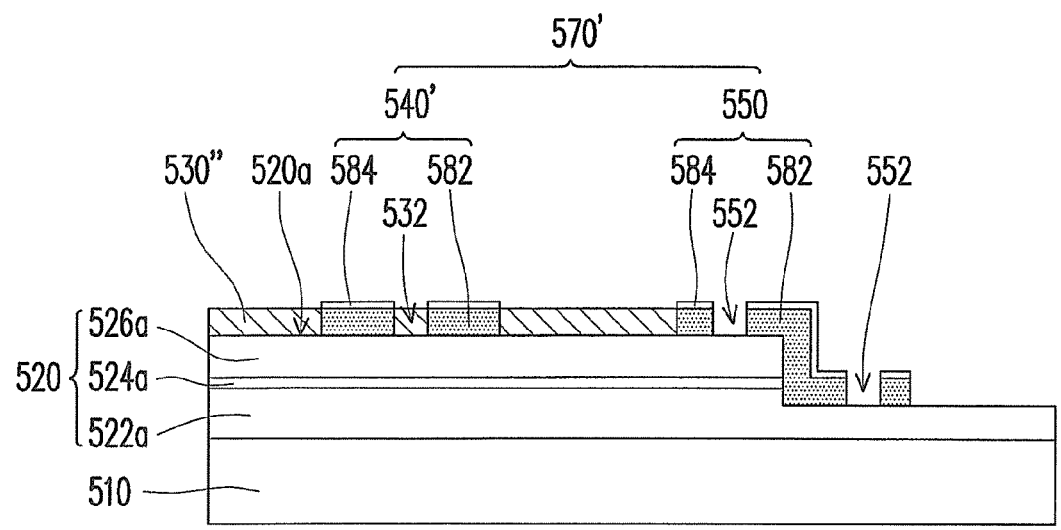
FIGS. 11A to 11B schematically illustrate cross-sectional views of a fabricating process of a light emitting diode chip according to another mode of embodiment of the present invention.
Figure 11B:
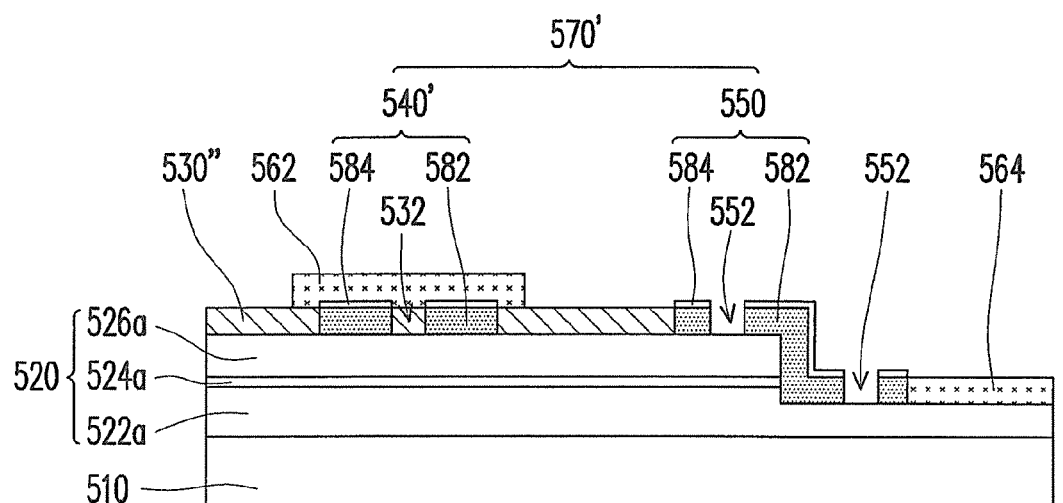

FIGS. 11A to 11B schematically illustrate cross-sectional views of a fabricating process of a light emitting diode chip according to another mode of embodiment of the present invention. Firstly, a light emitting diode chip 500b is formed by first applying the fabricating steps as shown by FIGS. 9A to 9B and FIG. 10A. Thus, a relevant description thereof is not reiterated herein.

Afterwards, a current spreading layer 530" is formed on a portion of the semiconductor device layer 520, as illustrated by FIG. 11A. In the present embodiment, the current spreading layer 530" is formed, for example, by using the method of forming the current spreading layer 530'. Moreover, a relevant illustration can be referred to the foregoing and is omitted herein. Here, the only difference between the current spreading layer 530" and the current spreading layer 530' is that mask patterns of different shapes are used.

In the present embodiment, as the current blocking layer 540' has the opening 532, the current spreading layer 530" is formed on a portion of the semiconductor device layer 520. Hence, the current spreading layer 530" will contact with the upper surface 520a of the second type semiconductor device layer 526a through the opening 532, as shown in FIG. 11A.

After the completion of the foregoing steps, the first electrode 562 is formed on the current spreading layer 530' and a portion of the patterned functional layer 570', and the second electrode 564 is formed on the semiconductor device layer 520, as illustrated by FIG. 11B. In the present embodiment, the first electrode 562 and the second electrode 564 are formed, for example, by the fabricating method mentioned above, thus the method is not reiterated herein. Up to this step, the process of fabricating the light emitting diode chip 500b is generally completed.

Similarly, in the present embodiment, the method of fabricating the light emitting diode chip 500b is similar to that of the light emitting diode chip 500a. The only difference between the two methods is that the current spreading layer 530" and the current spreading layer 530' have different mask pattern designs. Hence, upon completion of the following electrode fabrication, the structure of the light emitting diode chip 500b will be different from that of the light emitting diode chip 500a. However, the light emitting diode chip 500b is formed by the fabricating steps of the light emitting diode chip 500a, except for the different designs of the mask patterns in some steps. As a result, the light emitting diode chip 500b also has the same advantages as that of the light emitting diode chips 500a and 500 do, and a relevant description thereof is thus omitted.

The Fifth Embodiment

Figure 12A:
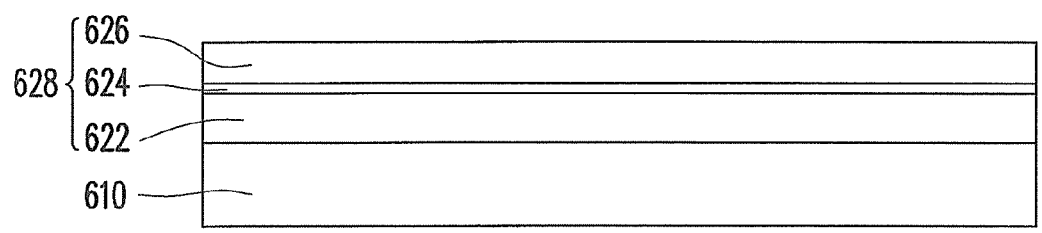
FIGS. 12A through 12E schematically illustrate cross-sectional views of a fabricating process of a light emitting diode chip according to a fifth embodiment of the present invention.

FIGS. 12A through 12E schematically illustrate cross-sectional views of a fabricating process of a light emitting diode chip according to a fifth embodiment of the present invention. Firstly, a first type semiconductor material layer 622, a light emitting material layer 624, and a second type semiconductor material layer 626 are sequentially formed on a substrate 610 to form a semiconductor layer 628, as illustrated by FIG. 12A. The steps of fabricating the semiconductor layer 628 on the substrate 610 are the same as those of fabricating the semiconductor layer 228 on the substrate 210, for example. Thus, a relevant description can be referred to the foregoing embodiments, and is not reiterated herein. Moreover, a material of the substrate 610 is, for example, a material described for the substrate 610. The material layers 622, 624, and 626 are the same as the material layers 222, 224, and 226 of the foregoing embodiments. Thus, a relevant description is not repeated herein.

Figure 12B:
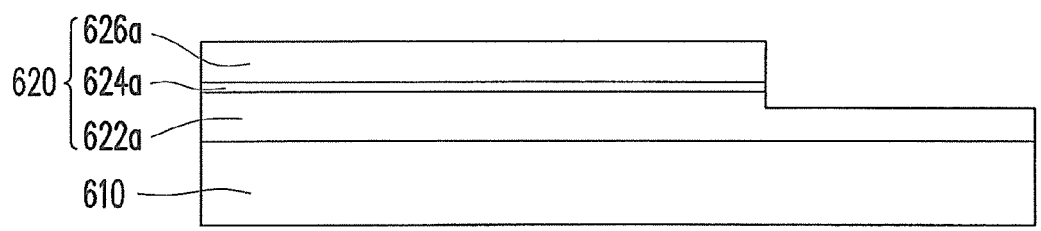

Afterwards, the semiconductor layer 628 is patterned to form a semiconductor device layer 620, as illustrated in FIG. 12B. In the present embodiment, the semiconductor device layer 620 is formed, for example, by a conventional PEP. Upon the completion of the foregoing process of fabricating the semiconductor layer 628, the second type semiconductor material layer 626, the light emitting material layer 624, and the first type semiconductor material layer 622 are patterned by the PEP to form a first type semiconductor device layer 622a, a light emitting device layer 624a, and a second type semiconductor layer device r 626a, as illustrated in FIG. 12B. Herein, the light emitting layer 624a is disposed on a portion of the first type semiconductor device layer 622a, and the second type semiconductor device layer 626a is disposed on the light emitting device layer 624a. Up to this point, the steps of fabricating the semiconductor device layer 620 are generally completed.

Figure 12C:
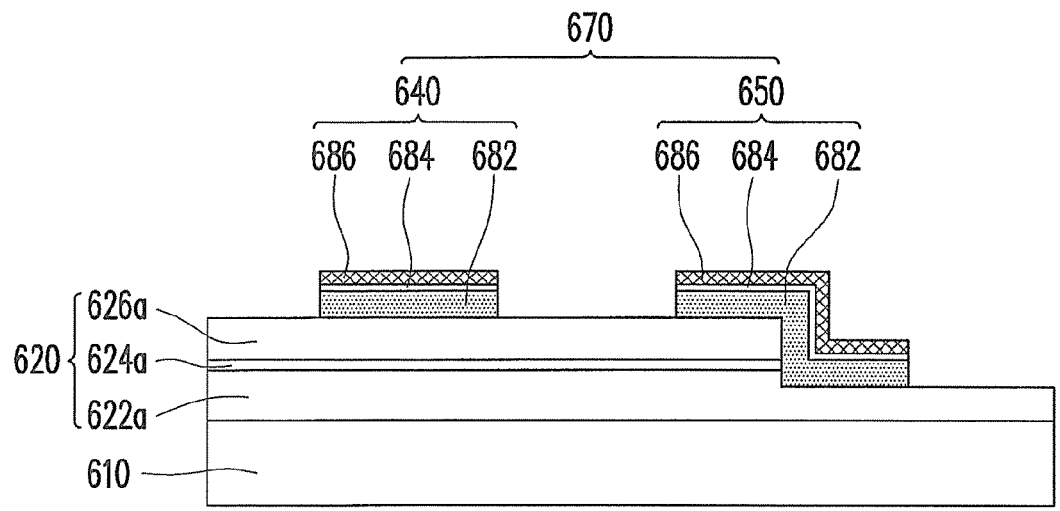

Next, a patterned functional layer 670 with multi-layer structure is formed simultaneously on a portion of the semiconductor device layer 620 as illustrate in FIG. 12C. In the present embodiment, the patterned functional layer 670 is formed, for example, by forming a first dielectric layer 682 entirely on the semiconductor device layer 620. Then, an alignment identification layer 684 is formed entirely on the first dielectric layer 682. Next, a second dielectric layer 686 is formed on the alignment identification layer 684. Finally, the first dielectric layer 682, the alignment identification layer 684, and the second dielectric layer 686 are patterned by the PEP to form a current blocking layer 640 and a passivation layer 650 simultaneously as shown in FIG. 12C. In detail, the patterned functional layer 670 of the present embodiment mainly uses the PEP to form the current blocking layer 640 and the passivation layer 650 simultaneously so as to reduce the fabricating steps. On the other hand, the patterned functional layer 670 has a film structure of dielectric layer-metal layer-dielectric layer, thus, the occurring of a short circuit between electrodes can be prevented when an electrode structure is subsequently fabricated.

In the present embodiment, a material of the alignment identification layer 684 is, for example, the material described for the alignment identification layer 484 in the previous embodiment. In addition, a material of at least one of the first dielectric layer 682 and the second dielectric layer 684 is, for example, the material mentioned for the first dielectric layer 482 in the previous embodiment. Thus, a relevant illustration can be referred to the foregoing and is not omitted herein. Hence, the current blocking layer 640 and the passivation layer 650 formed by the films 682, 684, and 686 can be identified by a color of the alignment identification layer 684 so that an alignment in the following fabricating process may be performed conveniently.

Figure 12D:
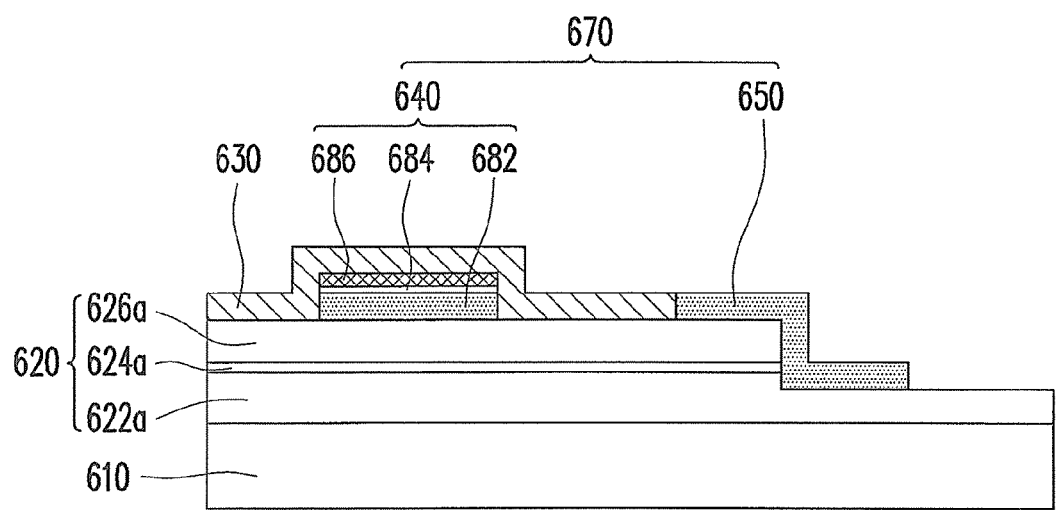

Upon completion of the steps aforementioned, a current spreading layer 630 is formed on a portion of the patterned functional layer 670 and a portion of the semiconductor device layer 620 as illustrated by FIG. 12D. In the present embodiment, the current spreading layer 630 is formed, for example, by the conventional PEP. In an embodiment of the present invention, a conductive layer (not shown) is formed entirely on the second type semiconductor device layer 626a and the current blocking layer 640. Herein, the current blocking layer 640 is, for example, a portion of the patterned functional layer 670 aforementioned. Afterwards, the conductive layer is patterned by the PEP to form the current spreading layer 630 as shown by FIG. 12D. Additionally, the material of the current spreading layer 630 of the present embodiment is exemplified by an indium tin oxide. In other embodiments, the material of the current spreading layer 630 may also be materials mentioned in the current spreading layer 230. Therefore, a relevant illustration can be referred to the foregoing embodiments and is not repeated herein.

Figure 12E:
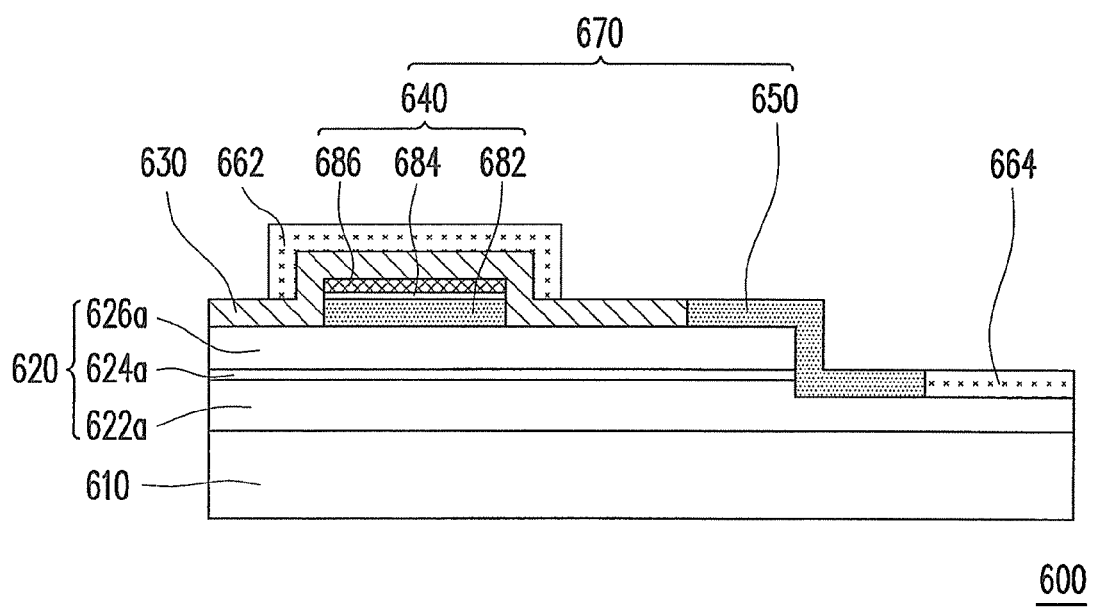

Next, a first electrode 662 is formed on the current spreading layer 630 and a second electrode 664 is formed on the semiconductor device layer 620. In the present embodiment, the first electrode 662 and the second electrode 664 are formed, for example, by the conventional PEP. In an embodiment of the present invention, a patterned photoresist layer (not shown) can be first formed on the current spreading layer 630 and the semiconductor device layer 620. Afterwards, an electrode material layer (not shown) is formed entirely on the substrate 610. Then, the patterned photoresist layer is removed, such that the electrode material layer on the patterned photoresist layer is also removed to form the first electrode 662 and the second electrode 664 as shown in FIG. 12E. Up to this point, the process of fabricating a light emitting diode chip 600 is generally completed.

In light of the foregoing, the steps of fabricating the light emitting diode chip 600 mainly form the first dielectric layer 682, the alignment identification layer 684, and the second dielectric layer 686 entirely, and then fabricate the current blocking layer 640 and the passivation layer 650 simultaneously by the PEP. Hence, the method of fabricating the light emitting diode chip 600 not only reduces the fabrication steps, cost, and time, but also prevents the short circuit that results from the electrical connection between electrodes when the electrode structure is subsequently formed. Besides, the current blocking layer 640 and the passivation layer 650 are composed of the first dielectric layer 682, the alignment identification layer 684, and the second dielectric layer 686. Thus, the current blocking layer 640 and the passivation layer 650 can have a better identity used as an identification tool for alignment to increase the alignment accuracy in the following process. Similarly, when the silicon carbide based material is applied in the current blocking layer 640, the current blocking layer 640 will not be easily eroded by a BOE process with the use of HF, etc. Thus, the fabricating process will have a better reliability.

It should be noted that a concept of using the patterned functional layer 670 with multi-layer structure in the method of fabricating the light emitting diode chip 600 can also be applied in the methods of fabricating the light emitting diode chips 400, 400a, and 400b. In other words, in the methods of fabricating the light emitting diode chips 400, 400a, and 400b, the original patterned functional layers 470 and 470' can apply the concept of the patterned functional layer 670 and further develop other possible embodiments. The combination and application of relevant fabricating steps can be referred to the foregoing embodiments, and thus are not reiterated herein.

In summary, the light emitting diode chip provided in the present invention has at least the following advantages. Firstly, the current blocking layer and the current spreading layer are fabricated simultaneously with the PEP. Hence, the steps of fabricating the light emitting diode chip can be reduced so as to save the fabrication cost and the fabrication time. Moreover, the accuracy and convenience of the alignment in the following fabricating process are increased through the patterned functional layer with multi-layer structure, or the identification recesses. In addition, when a specific material, such as a silicon carbide based material, is utilized in the current blocking layer, the current blocking layer will not be easily eroded by the BOE process with the use of HF, etc. Thus, the fabricating process will have a better reliability.

Though the present invention has been disclosed above by the embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A method of fabricating a light emitting diode chip, comprising:
   forming a semiconductor device layer on a substrate;
   forming a patterned functional layer with multi-layer structure simultaneously on a portion of the semiconductor device layer;
   forming a current spreading layer on a portion of the patterned functional layer and a portion of the semiconductor device layer;
   forming a first electrode on the current spreading layer; and
   forming a second electrode on the semiconductor device layer.

2. The method of fabricating the light emitting diode chip as claimed in claim 1, wherein the method of forming the semiconductor device layer comprises:
   forming a semiconductor layer on the substrate; and
   patterning the semiconductor layer to form the semiconductor device layer.

3. The method of fabricating the light emitting diode chip as claimed in claim 1, wherein the method of forming the semiconductor device layer comprises:
   forming a first type semiconductor material layer, a light emitting material layer, and a second type semiconductor material layer sequentially on the substrate; and patterning the second type semiconductor material layer, the light emitting material layer, and the first type semiconductor material layer to form a first type semiconductor layer, a light emitting layer, and a second type semiconductor layer, wherein the light emitting layer is disposed on a portion of the first type semiconductor layer, and the second type semiconductor layer is disposed on the light emitting layer.

4. The method of fabricating the light emitting diode chip as claimed in claim 1, wherein the method of forming the patterned functional layer comprises:
   forming a first dielectric layer on the semiconductor device layer;
   forming an alignment identification layer on the first dielectric layer; and
   patterning the first dielectric layer and the alignment identification layer to form a current blocking layer and a passivation layer simultaneously.

5. The method of fabricating the light emitting diode chip as claimed in claim 1, wherein the method of forming the patterned functional layer comprises:
   forming a first dielectric layer on the semiconductor device layer;
   forming an alignment identification layer on the first dielectric layer; and
   patterning the first dielectric layer and the alignment identification layer to simultaneously form a current blocking layer, a passivation layer, and an isolating trench disposed within the passivation layer.

6. The method of fabricating the light emitting diode chip as claimed in claim 1, wherein the method of forming the patterned functional layer comprises:
   forming a first dielectric layer on the semiconductor device layer;
   forming an alignment identification layer on the first dielectric layer;
   forming a second dielectric layer on the alignment identification layer; and
   patterning the first dielectric layer, the alignment identification layer, and the second dielectric layer to form a current blocking layer and a passivation layer simultaneously.

7. The method of fabricating the light emitting diode chip as claimed in claim 1, wherein the method of forming the patterned functional layer comprises:
   forming a first dielectric layer on the semiconductor device layer;
   forming an alignment identification layer on the first dielectric layer;
   forming a second dielectric layer on the alignment identification layer; and
   patterning the first dielectric layer, the alignment identification layer, and the second dielectric layer to simultaneously form a current blocking layer, a passivation layer, and an isolating trench disposed within the passivation layer.

8. The method of fabricating the light emitting diode chip as claimed in claim 4, wherein a material of the first dielectric layer or the second dielectric layer comprises a silicon carbide based material.

9. The method of fabricating the light emitting diode chip as claimed in claim 8, wherein the silicon carbide based material comprises $SiO_xC_y$: H, SiC, $SiC_xN_y$, or $SiO_xC_yN_z$.

10. The method of fabricating the light emitting diode chip as claimed in claim 5, wherein a material of the first dielectric layer or the second dielectric layer comprises a silicon carbide based material.

11. The method of fabricating the light emitting diode chip as claimed in claim 6, wherein a material of the first dielectric layer or the second dielectric layer comprises a silicon carbide based material.

12. The method of fabricating the light emitting diode chip as claimed in claim 7, wherein a material of the first dielectric layer or the second dielectric layer comprises a silicon carbide based material.

13. The method of fabricating the light emitting diode chip as claimed in claim 4, wherein a material of the first dielectric layer or the second dielectric layer comprises silicon oxide or silicon nitride.

14. The method of fabricating the light emitting diode chip as claimed in claim 5, wherein a material of the first dielectric layer or the second dielectric layer comprises silicon oxide or silicon nitride.

15. The method of fabricating the light emitting diode chip as claimed in claim 6, wherein a material of the first dielectric layer or the second dielectric layer comprises silicon oxide or silicon nitride.

16. The method of fabricating the light emitting diode chip as claimed in claim 7, wherein a material of the first dielectric layer or the second dielectric layer comprises silicon oxide or silicon nitride.

17. The method of fabricating the light emitting diode chip as claimed in claim 4, wherein a material of the alignment identification layer comprises a metal.

18. The method of fabricating the light emitting diode chip as claimed in claim 5, wherein a material of the alignment identification layer comprises a metal.

19. The method of fabricating the light emitting diode chip as claimed in claim 6, wherein a material of the alignment identification layer comprises a metal.

20. The method of fabricating the light emitting diode chip as claimed in claim 7, wherein a material of the alignment identification layer comprises a metal.

21. The method of fabricating the light emitting diode chip as claimed in claim 4, wherein the method of forming the current spreading layer comprises:
   forming a conductive layer on the second type semiconductor layer and the current blocking layer; and
   patterning the conductive layer to form the current spreading layer.

22. The method of fabricating the light emitting diode chip as claimed in claim 5, wherein the method of forming the current spreading layer comprises:
   forming a conductive layer on the second type semiconductor layer and the current blocking layer; and
   patterning the conductive layer to form the current spreading layer.

23. The method of fabricating the light emitting diode chip as claimed in claim 6, wherein the method of forming the current spreading layer comprises:
   forming a conductive layer on the second type semiconductor layer and the current blocking layer; and
   patterning the conductive layer to form the current spreading layer.

24. The method of fabricating the light emitting diode chip as claimed in claim 7, wherein the method of forming the current spreading layer comprises:
   forming a conductive layer on the second type semiconductor layer and the current blocking layer; and
   patterning the conductive layer to form the current spreading layer.

25. The method of fabricating the light emitting diode chip as claimed in claim 4, wherein the current blocking layer has an opening to expose an upper surface of the second type semiconductor layer, and the current spreading layer contacts with the upper surface of the second type semiconductor layer through the opening.

26. The method of fabricating the light emitting diode chip as claimed in claim 5, wherein the current blocking layer has an opening to expose an upper surface of the second type semiconductor layer, and the current spreading layer contacts with the upper surface of the second type semiconductor layer through the opening.

27. The method of fabricating the light emitting diode chip as claimed in claim 6, wherein the current blocking layer has an opening to expose an upper surface of the second type semiconductor layer, and the current spreading layer contacts with the upper surface of the second type semiconductor layer through the opening.

28. The method of fabricating the light emitting diode chip as claimed in claim 7, wherein the current blocking layer has an opening to expose an upper surface of the second type semiconductor layer, and the current spreading layer contacts with the upper surface of the second type semiconductor layer through the opening.

* * * * *